United States Patent
Davis et al.

(10) Patent No.: US 12,416,452 B2
(45) Date of Patent: Sep. 16, 2025

(54) METHODS FOR INTERFACING A METALLIC MICROCHANNEL AND A METALLIC CAPILLARY

(71) Applicant: BRIGHAM YOUNG UNIVERSITY, Provo, UT (US)

(72) Inventors: Henry Davis, Provo, UT (US); Brian Jensen, Orem, UT (US); Nathan B. Crane, Vinyard, UT (US); Robert C. Davis, Provo, UT (US); James Harkness, Mapleton, UT (US); Isa Kohls, Provo, UT (US); Richard Vanfleet, Provo, UT (US)

(73) Assignee: BRIGHAM YOUNG UNIVERSITY, Provo, UT (US)

( * ) Notice: Subject to any disclaimer, the term of this patent is extended or adjusted under 35 U.S.C. 154(b) by 295 days.

(21) Appl. No.: 17/815,733

(22) Filed: Jul. 28, 2022

(65) Prior Publication Data
US 2023/0038278 A1    Feb. 9, 2023

Related U.S. Application Data

(60) Provisional application No. 63/227,041, filed on Jul. 29, 2021.

(51) Int. Cl.
*F28D 15/04* (2006.01)
*B22F 3/10* (2006.01)
(Continued)

(52) U.S. Cl.
CPC .............. *F28D 15/046* (2013.01); *B22F 3/10* (2013.01); *B22F 5/10* (2013.01); *B22F 10/28* (2021.01);
(Continued)

(58) Field of Classification Search
CPC ................... F28D 15/046; F28D 2015/0225; B22F 3/10; B22F 5/10; B22F 10/28;
(Continued)

(56) References Cited

U.S. PATENT DOCUMENTS 6,148,508 A * 11/2000 Wolk ................ B01L 3/502707
                                                            204/604
6,564,860 B1 * 5/2003 Kroliczek ............. F28D 15/043
                                                            29/890.032
(Continued)

OTHER PUBLICATIONS

Abraham, et al., "Classification of stationary phases and other materials by gas chromatography", Journal of Chromatography A, 1999, pp. 79-114.
(Continued)

*Primary Examiner* — Kyle A Cook
(74) *Attorney, Agent, or Firm* — Ballard Spahr LLP

(57) ABSTRACT

Embodiments disclosed are systems and methods for interfacing a metallic capillary in a microchannel of a metallic body. A method may include inserting a portion of the metallic capillary into a portion the microchannel of the metallic body, sintering the portion of the metallic capillary to the portion of the microchannel of the metallic body, disposing a sacrificial powder at least proximate to the metallic capillary and the metallic body after sintering the portion of the metallic capillary and the portion of the microchannel of the metallic body, and infiltrating at least the portion of the metallic capillary sintered to the portion of the microchannel of the metallic body with an infiltrant in the presence of the sacrificial powder disposed at least proximate to the metallic capillary and the metallic body.

13 Claims, 13 Drawing Sheets

(51) Int. Cl.
| | |
|---|---|
| *B22F 5/10* | (2006.01) |
| *B22F 10/28* | (2021.01) |
| *B22F 10/62* | (2021.01) |
| *B33Y 10/00* | (2015.01) |
| *B33Y 40/20* | (2020.01) |
| *B33Y 70/00* | (2020.01) |
| *B33Y 80/00* | (2015.01) |
| *B81B 1/00* | (2006.01) |
| *B81C 1/00* | (2006.01) |
| *F28D 15/02* | (2006.01) |

(52) U.S. Cl.
CPC ............ *B22F 10/62* (2021.01); *B33Y 10/00* (2014.12); *B33Y 40/20* (2020.01); *B33Y 70/00* (2014.12); *B33Y 80/00* (2014.12); *B81B 1/00* (2013.01); *B81C 1/00071* (2013.01); *B22F 2301/10* (2013.01); *B22F 2301/35* (2013.01); *B22F 2998/10* (2013.01); *B81C 2201/0128* (2013.01); *F28D 2015/0225* (2013.01)

(58) Field of Classification Search
CPC .......... B22F 10/62; B22F 2301/10; B22F 2301/35; B22F 2998/10; B22F 3/26; B22F 7/06; B22F 10/60; B33Y 10/00; B33Y 40/20; B33Y 70/00; B33Y 80/00; B81B 1/00; B81B 2201/058; B81B 2203/0338; B81C 1/00071; B81C 2201/0128; B81C 2203/038; B81C 3/001; F28F 2260/02; C22C 33/0242; Y02P 10/25

See application file for complete search history.

(56) References Cited

U.S. PATENT DOCUMENTS

| | | | | |
|---|---|---|---|---|
| 2003/0173720 A1* | 9/2003 | Musso | ................ | H01L 21/4871 257/E23.099 |
| 2019/0096536 A1* | 3/2019 | Arafat | .................... | F28D 15/06 |

OTHER PUBLICATIONS

Bhattacharjee, et al., "The upcoming 3D-printing revolution in microfluidics", Royal Society of Chemistry; Lab on a Chip, Apr. 2016, pp. 1720-1742.

Davis, et al., "Pressure Control during Bronze Infiltration of Binder-Jet Printed Stainless-Steel to Create Metal Microchannels", 2021, 9 pages.

Davis, et al., "Sacrificial Powder Pressure Control for Infiltration of Microscale Metal Parts", 2021, 13 pages.

Dodds, et al., "Capillary Pressure Curves of Sphere Packings: Correlation of Experimental Results and Comparison with Predictions from a Network Model of Pore Space", Particle & Particle Systems Characterization, vol. 23, Issue 1, Jun. 26, 2006, pp. 29-39.

Elliot, et al., "Experimental Study of the Maximum Resolution and Packing Density Achievable in Sintered and Non-Sintered Binder-Jet 3D Printed Steel Microchannels", Advanced Manufacturing, vol. 2, ASME 2015 International Mechanical Engineering Congress and Exposition, American Society of Mechanical Engineers, Mar. 7, 2016.

Ghosh, et al., "Microchip gas chromatography columns, interfacing and performance", Talanta, May 2018, pp. 463-492.

Juvet, "Gas Chromatography", Analytical Chemistry; https://doi.org/10.1021/ac60211a003, Apr. 1964, pp. 36-51.

Kohls, "Fabricating Micro-Channels using 3D Printing and Infiltration", BYU Senior thesis, 2021.

Lee, et al., "Surface Tension and its Temperature Coefficient of Liquid Sn-X (X=Ag, Cu) Alloys", Materials Transactions, vol. 45, No. 9, Jul. 14, 2004, pp. 2864-2870.

Lorenz, et al., "Freeze-Off Limits in Transient Liquid-Phase Infiltration", Metallurgical and Materials Transactions A, vol. 35A, Feb. 2004, pp. 641-653.

Mostafaei, et al., "Binder jet 3D printing—Process parameters, materials, properties, modeling, and challenges", Progress in Materials Science, 2021, pp. 1-138.

Navarro-González, et al., "The limitations on organic detection in Mars-like soils by thermal volatilization-gas chromatography-MS and their implications for the Viking results", Proceedings of the National Academy of Sciences, Sep. 2006, pp. 16089-16094.

Nielsen, et al., "3D Printed Microfluidics 23", Annu Rev Anal Chem (Palo Alto Calif). doi:10.1146/annurevanchem-091619-102649., Jun. 12, 2020, pp. 45-65.

Rahman, et al., "Basic overview on gas chromatography columns", Analytical Separation Science, 2015, pp. 823-834.

Rogers, et al., "3D Printed Microfluidic Devices with Integrated Valves", Department of Chemistry and Biochemistry and Department of Electrical and Computer Engineering, Brigham Young University, Biomicrofluidics 9, Jan. 13, 2015, p. 016501-1-016501-9.

Sachs, et al., "Production of Injection Molding Tooling with Conformal Cooling Channels Using the Three Dimensional Printing Process", Polymer Engineering and Science vol. 40, Issue 5, Apr. 8, 2004, pp. 1232-1247.

Ziaee, et al., "Binder jetting: A review of process, materials, and methods", Additive Manufacturing,, Jun. 2019, pp. 781-801.

\* cited by examiner

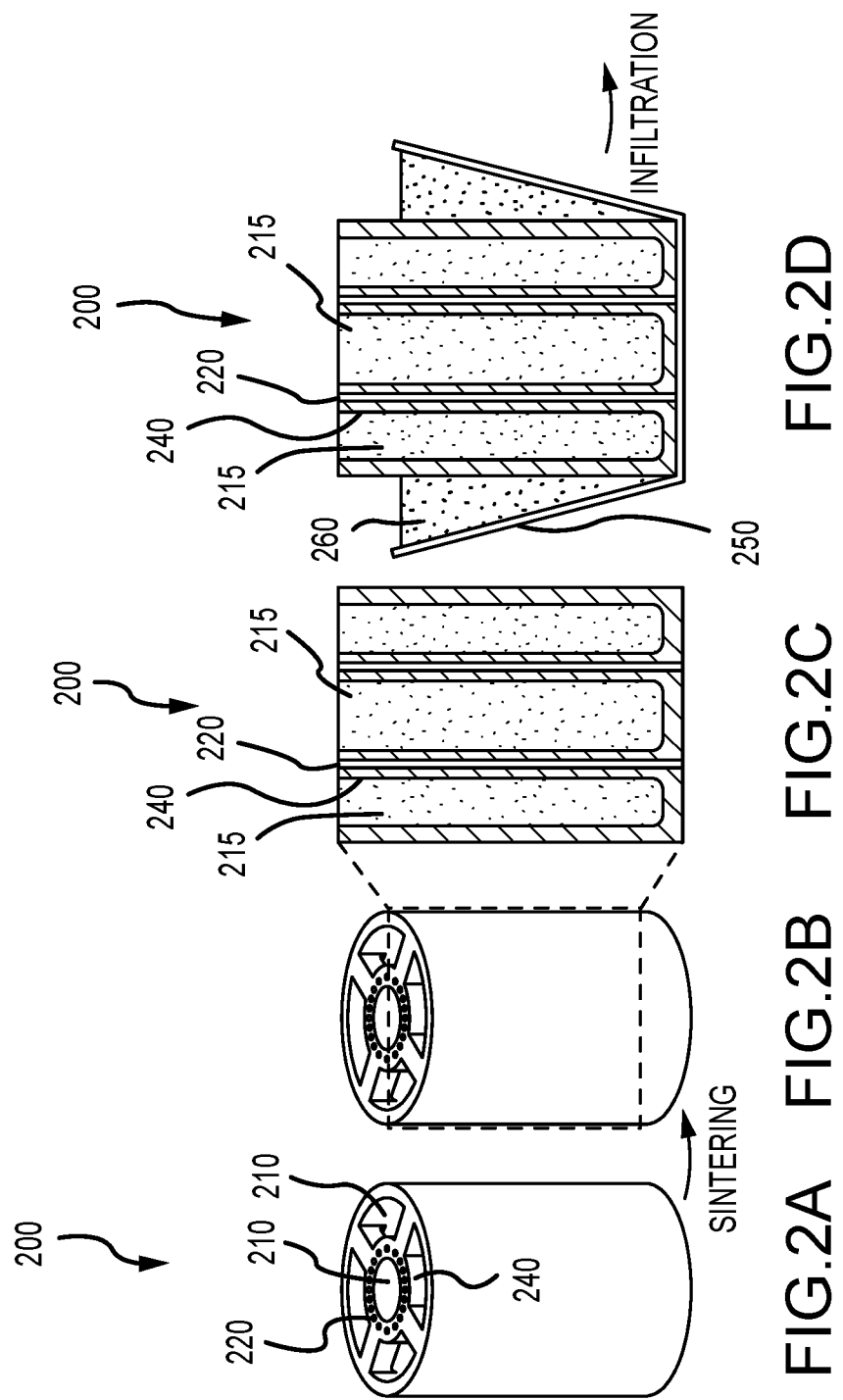

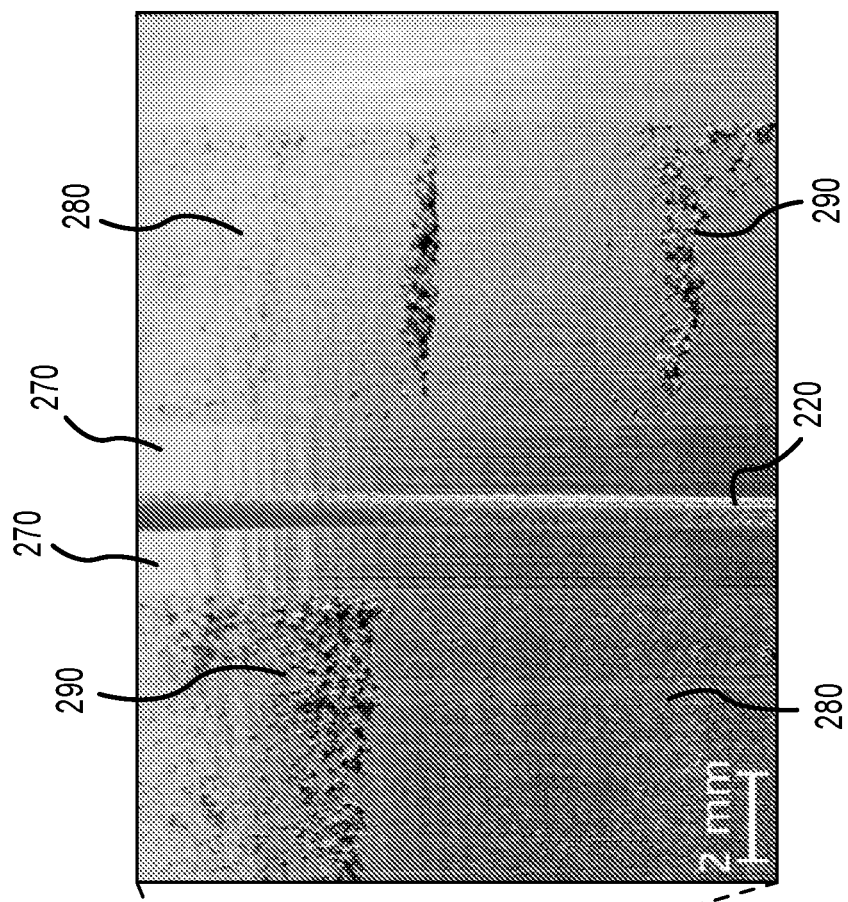
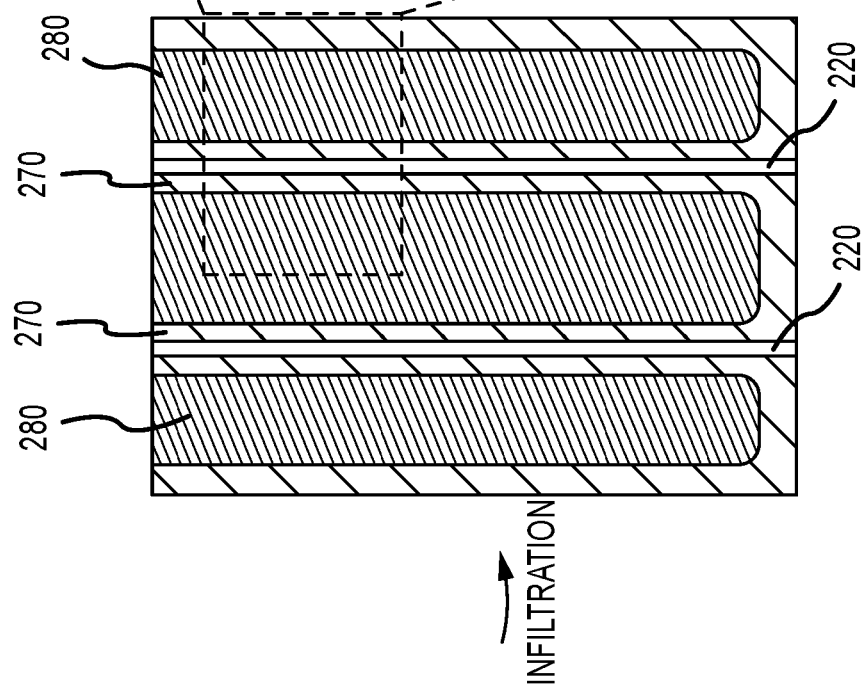
FIG. 3
FIG. 2E

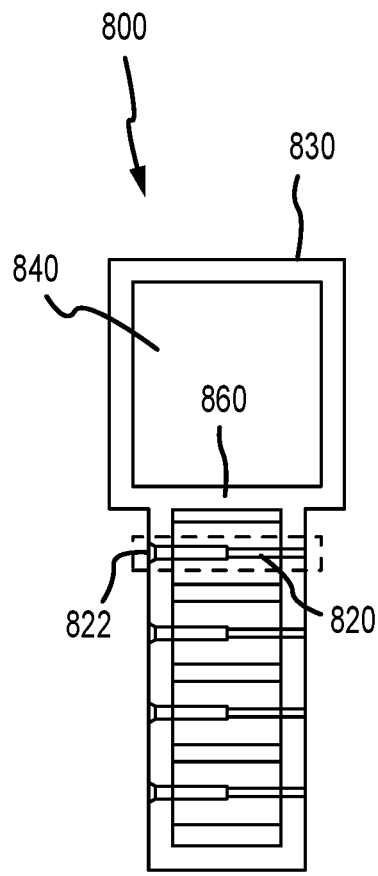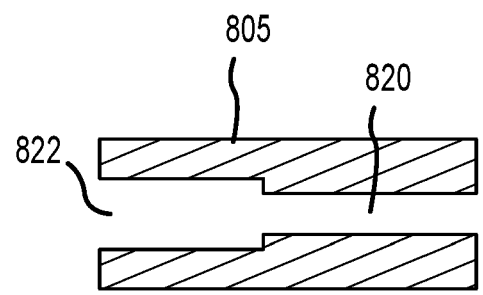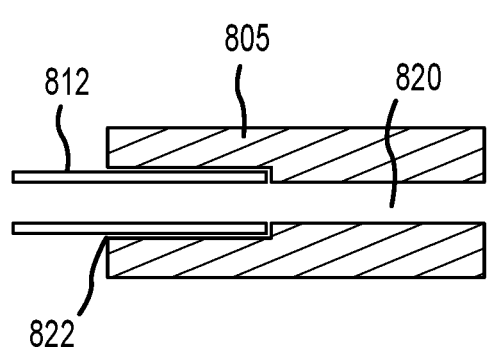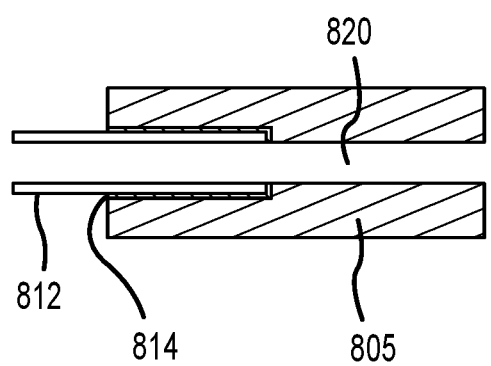

METHODS FOR INTERFACING A METALLIC MICROCHANNEL AND A METALLIC CAPILLARY

CROSS-REFERENCE TO RELATED APPLICATIONS

This application claims priority to U.S. Provisional Patent Application No. 63/227,041 filed on Jul. 29, 2021, the disclosure of which is incorporated herein, in its entirety, by this reference.

BACKGROUND

The ability to create high resolution complex structures has enabled additive manufacturing (AM) to revolutionize some microfabrication processes with applications ranging from micro robotics to multilayer printed circuits. Recent efforts have enabled the use of AM in microfluidic applications by using polymer AM to create complex microchannels. Traditionally, microfluidic devices have been fabricated using cleanroom lithography with etching or molding fabrication processes. These processes allow for precise microscale features, but they are only compatible with a few materials and lack the ability to form complex 3D designs. Some microfluidic applications like micro heat exchangers or microcolumns for gas chromatography could benefit from the design flexibility inherent in additive manufacturing but call for high temperatures and high thermal conductivity. Laser powder bed fusion (LPBF) is one method that has been used to form metal microchannels for microfluidic applications.

SUMMARY

Embodiments disclosed herein are systems and methods for interfacing a metallic capillary in a microchannel of a metallic body, and system including related devices. In an embodiment, a method for interfacing a metallic capillary in a microchannel of a metallic body is described. The method includes inserting a portion of the metallic capillary into a portion the microchannel of the metallic body, sintering the portion of the metallic capillary to the portion of the microchannel of the metallic body, disposing a sacrificial powder at least proximate to the metallic capillary and the metallic body after sintering the portion of the metallic capillary and the portion of the microchannel of the metallic body, and infiltrating at least the portion of the metallic capillary sintered to the portion of the microchannel of the metallic body with an infiltrant in the presence of the sacrificial powder disposed at least proximate to the metallic capillary and the metallic body.

In an embodiment, a microfluidic system includes a metallic structure, an inlet metallic capillary, and an outlet metallic capillary. The metallic structure defines an inlet, an outlet, and a microchannel extending therein between the inlet and the outlet, the microchannel having a width of less than about 1000 μm. The inlet metallic capillary interfaces the metallic structure at an inlet interface at least proximate to the inlet of the metallic structure. The inlet interface between a portion of the inlet metallic capillary and the metallic structure at the inlet is devoid of an adhesive and devoid of gaps or spaces between the portion of the inlet metallic capillary and the metallic structure at the inlet. The outlet metallic capillary interfaces the metallic structure at an outlet interface at least proximate to the outlet of the metallic structure. The outlet interface between a portion of the outlet metallic capillary and the metallic structure at the outlet is devoid of an adhesive and devoid of gaps or spaces between the portion of the outlet metallic capillary and the metallic structure at the outlet.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the present disclosure, wherein identical reference numerals refer to identical or similar elements or features in different views or embodiments shown in the drawings.

FIGS. 2A-2E are various views of a printed part during an infiltration process, according to an embodiment.

FIG. 3 is an image of a milled sample post-infiltration taken from square 3 of FIG. 2D.

FIG. 8A-F are various view of a metallic capillary and a metallic support during an interfacing process, according to an embodiment.

FIG. 8G is an image of a milled portion of an inlet of a metallic structure interfacing a metallic capillary.

DETAILED DESCRIPTION

Figure 1C:
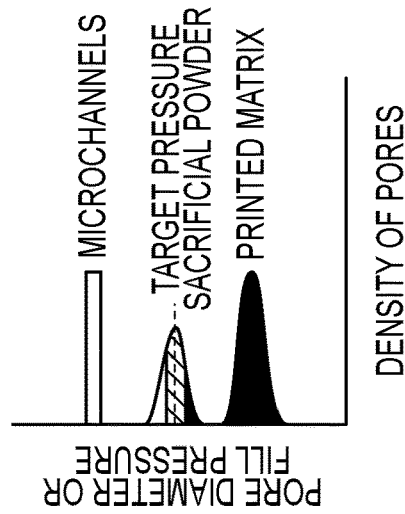
FIG. 1C is a diagram illustrating predicted infiltration of a sample with sacrificial powder controlled infiltrant pressure.

Embodiments disclosed herein include systems and methods for fabricating metallic structures having microchannels extending therethrough. In some embodiments, stainless-steel binder jet three-dimensional (3D) printing and bronze infiltrations are used to create long, compact microchannels in a metallic structure (e.g., metallic block or metallic chip). For example, the binder jet 3D printer may be used to print a plurality of plates, at least some of which have an elongated slot recessed therein on a face or surface of the respective plate. 3D printing allows for high versatility and complexity in design of the microchannels. The plurality of plates are then stacked, according to an embodiment, such that the elongated slots in the plates are covered by an adjacent plate and a microchannel is formed between adjacent plates. The plurality of plates are then thermally bonded (e.g., sintered) and infiltrated, according to an embodiment. In at least some embodiments, the infiltrant fills pores within the plates near or proximate to the microchannels and between plates, sealing adjacent plates together. In this approach, bronze or other infiltrant may fill the porous material produced by binder jetting without filling the formed microchannels. Thus, infiltration also may be performed in the presence of a sacrificial powder (e.g., sacrificial powder infiltration (SPI)), which prevents overflow of the infiltrant into the microchannels, according to an embodiment. For example, sacrificial powder reservoirs (with pore size of about 60 µm, in some embodiments) may be used to control infiltrant pressure during infiltration. With pressure control, the infiltrant may selectively fill small particles in the printed plates (with pore sizes of about 3 µm or less) while leaving the microchannels (width or diameter of about 500 µm to about 1000 µm) empty. The resulting metallic structure included effective microchannels. The use of plates during fabrication also allows for easy clearing of excess powder during the process. The metallic structures formed according to the systems and methods described herein may be used in systems including microchannels, such as micro-gas chromatography (GC) and/or micro heat exchangers.

Traditionally, microfluidic devices have been fabricated using cleanroom lithography with etching or molding fabrication processes. These processes allow for precise microscale features, but are only compatible with a few materials and lack the ability to form complex 3D designs. Some microfluidic applications like micro heat exchangers or microcolumns for GC could benefit from the design flexibility inherent in the systems and methods described herein.

For example, in some embodiments, metal 3D binder jet printing is described for use in micro-gas GC column fabrication. The binder jet printed parts may be further processed by bronze infiltration to reduce porosity. Bronze infiltration also serves to create a gas-tight interface between the 3D printed columns and capillary tubing which is inserted into the printed part before thermal bonding and used for fluid connection to other instrumentation. To control bronze infiltration, sacrificial powder may be used during infiltration. It was observed that capillaries and microchannels formed according to one or more embodiments described herein were not plugged when tested by pressurizing the capillary (e.g., tube) with 100 psi of argon while underwater to detect leaks between the capillary and the printed part. Accordingly, at least one, some, or all embodiments described herein include gas-tight connections without plugging the capillaries.

Embodiments of systems and methods described herein may follow a capillary model. The capillary model of infiltration predicts that infiltrant will fill small pores preferentially over large pores and that pore filling is determined by fill pressure which is also called capillary pressure ($P_c$). $P_c$ is defined as the pressure of the infiltrant in a partially filled pore relative to the adjacent gas. $P_c$ is negative and governed by the following equation:

$$P_c = \frac{-4\sigma \cos(\theta)}{D}$$

where $\sigma$ is the infiltrant surface tension, $\theta$ is the contact angle, and D is the diameter of a long cylindrical pore. In a powder, the interstitial pores are non-cylindrical, with $P_c$ related to powder particle diameter by:

$$P_c = \frac{-6\sigma}{D_{sv}} \frac{(1-\varepsilon)}{\varepsilon}$$

where $\varepsilon$ is the porosity of the powder and $D_{sv}$ is the mean surface volume particle diameter.

The capillary model predicts that during infiltration, whether a pore fills will depend on its fill pressure and the infiltrant pressure. All pores with fill-pressure below (more negative than) the infiltrant pressure will fill, and all pores with fill-pressure above the infiltrant pressure will remain empty. Without external control, pores will fill until all infiltrant is used up. In this case, the final infiltrant pressure is determined by the smallest partially filled pore.

Figure 1B:
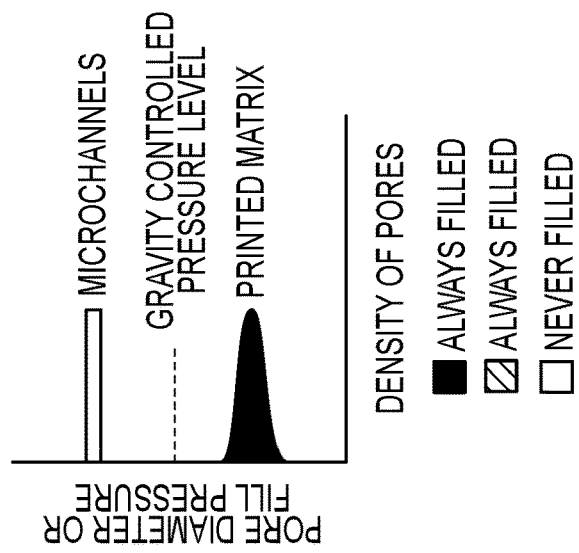
FIG. 1B is a diagram illustrating predicted infiltration of a sample with gravity controlled infiltrant pressures.
Figure 1A:
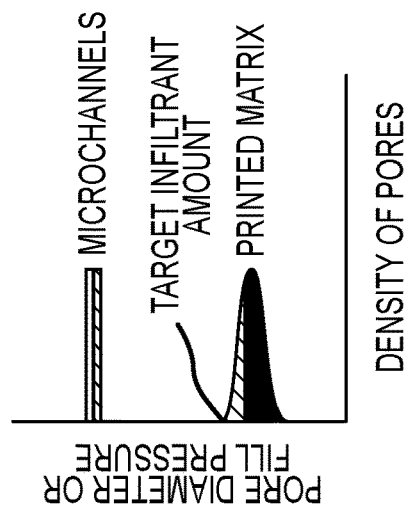
FIG. 1A is a diagram illustrating predicted infiltration of a sample without pressure control showing the potential for either an incompletely filled printed matrix or partially filled channels.

If a part could be infiltrated with the exact amount of infiltrant needed, the porous printed matrix would be filled while the channels would be left empty. However, in practice uncertainty in total pore volume will result sometimes in too much infiltrant, leaving filled channels. Other times the uncertainty would result in too little infiltrant, leaving a partially infiltrated printed matrix. This situation is illustrated in the plot in FIG. 1A, which illustrates infiltration of the printed matrix and microchannels without infiltrant pressure control. The sometimes-filled region (shown in cross hatch) comes from the uncertainty in total pore volume. Infiltrant pressure control can be used to overcome the problem caused by uncertainty in pore volume and is illustrated in FIGS. 1B and 1C. FIG. 1B illustrates gravimetric pressure control, wherein the infiltrant pressure is set above the fill pressure of the porous printed matrix but below the fill pressure of the microchannels. FIG. 1C illustrates sacrificial powder pressure control wherein infiltrant pressure is controlled by the size of the pores in a sacrificial powder reservoir. Uncertainty in total pore volume is still present but this uncertainty impacts only sacrificial powder, resulting in filled printed matrix and completely empty microchannels. Embodiments of systems and methods described herein utilize sacrificial powder pressure control as illustrated in FIG. 1C.

One advantage of using sacrificial pores to control infiltrant pressure, rather than gravity, is that sacrificial pores can more practically be used to keep small structures (such as microchannels) from filling. For example, a 250 µm channel is predicted to fill with infiltrant unless the infiltrant pressure is below −16 kPa, which would require a height of about 21 cm using gravimetric pressure control (calculated using $\Delta P = \rho g h$, where $\rho$ is the infiltrant density and g is the gravitational constant). This large height would make it more difficult to implement due to issues including the large furnace size and long infiltrant transport distances that would be required. However, a sacrificial powder reservoir with an effective pore diameter smaller than about 250 µm (powder diameter <500 µm) will achieve these infiltrant pressures.

In Example 2, described below, it is valuable to understand how the capillary pressure and fill height (maximum height of filled pores) compare for different sized pores. The difference in capillary pressure between two different diameter pores $D_1$ and $D_2$ can be derived using eq. 2, resulting in:

$$\Delta P_c = 4\sigma \text{Cos}(\theta)\left(\frac{1}{D_2} - \frac{1}{D_1}\right)$$

The infiltrant pressure $P_i$ also varies with height according to $\Delta P_i = \rho g h$. By modifying this equation, the expected difference in fill height between two pores can be found:

$$\Delta h = \frac{4\sigma \text{Cos}(\theta)}{\rho g}\left(\frac{1}{D_2} - \frac{1}{D_1}\right)$$

At pressure equilibrium, the capillary model predicted a uniform fill-height for channels of the same diameter. It also predicts the quantitative difference in fill-height between channels of different diameter.

In some embodiments, it was discovered that, through capillary action, a vertical cylindrical capillary will fill to a certain height H based on its radius r, the surface tension T, the contact angle θ, the density ρ of the fluid, and the acceleration of gravity g:

$$H = \frac{2T\text{Cos}(\theta)}{\rho g r}$$

This equation was applied to control infiltrant filling of variously sized pores. Capillary action caused pores with smaller radii to be filled before larger ones. By introducing a sacrificial pore size larger than the pore size of the stainless steel matrix and smaller than the channel diameter, the infiltrant flow can be controlled enough to seal the unwanted pores while keeping the channels clear. Sacrificial pores may be incorporated by placing a large grained powder around the printed channel.

In at least one, some, or all embodiments described herein, methods and systems are provided for sealing the porosity in binder jet printed parts with sub-millimeter scale internal structures. According to an embodiment, after printing and thermally bonding (e.g., sintering) a part, but prior to bronze infiltration, a reservoir of sacrificial powder is placed in contact with the part. While a sacrificial powder is referenced herein, in some embodiments other sacrificial agents having properties other than powder may be utilized. For example, the sacrificial agent may include a porous material that the infiltrant wets to during processing (e.g., heating). Accordingly, in some embodiments, a sacrificial porous metallic sponge having predetermined pore sizes (described below) may be used in place of the sacrificial powder described herein. In some embodiments, a sacrificial porous ceramic material configured such that the infiltrant wets to the sacrificial porous ceramic material may be used in place of the sacrificial powder described herein. In some embodiments, the sacrificial powder may be replaced with a sacrificial agent including a block (e.g., metallic block) having holes drilled or cut therein effect to provide constant pore size through the block. In some embodiments, the sacrificial powder may be replaced with a sacrificial agent including a bundle of wires (e.g., metallic wires). Another possible sacrificial powder or bead based sacrificial material may include ceramic particles and/or beads, or a reservoir of ceramic particles and/or beads that are used as is or activated for metallic infiltrant wetting prior to infiltration. The ceramic materials may include one or more of silica, alumina, tungsten carbide, silicon carbide, chromium oxide, zirconium oxide, or combinations thereof. The activation may include coating or chemical surface modification (e.g., reduction, oxidation, or small molecule bonding) to create a surface that will wet metals. Processes that could also include chemical modification or functionalization, painting and firing, or metallic plating (electroless or electroplating) or a combination thereof. In one embodiment, the ceramic surface could coated with a metallic paint, like a molybdenum based paint, and fired prior to infiltration.

Turning to FIGS. 2A-2E, an example of sacrificial powder infiltration process is provided. In FIG. 2A, a cylinder 200 is provided, having been 3D printed according to any of the printing processes described herein. The cylinder 200 includes an interior region 210 and an array of microchannels 220 disposed within an inner cylinder inside the cylinder 200. The cylinder 200 may be thermally bonded, as shown in FIG. 2B. Thermal bonding may include one or more of sintering, brazing, soldering, and/or combinations thereof. After thermal bonding, a sacrificial powder 215 is inserted into the interior region 210 of the cylinder 200, as shown in the cross-sectional view of FIG. 2C. The sacrificial powder 215 has pore dimensions larger than the pores in the porous printed matrix of the cylinder 200, but smaller than the microchannels 220.

In some embodiments, the sacrificial powder has a particle diameter of about 25 µm to about 250 µm, about 25 µm to about 125 µm, about 125 µm to about 225 µm, about 25 µm to about 50 µm, about 50 µm to about 100 µm, µm 100 to about 150 µm, about 150 µm to about 200 µm, about 200 µm to about 250 µm, about 25 µm to about 35 µm, about 70 µm to about 90 µm, about 175 µm to about 225 µm, about 30 µm, about 80 µm, or about 200 µm. In some embodiments, the sacrificial powder may form pores having a diameter of about 10 µm to about 150 µm, about 10 µm to about 50 µm, about 50 µm to about 100 µm, about 100 µm to about 150 µm, about 10 µm to about 30 µm, about 30 µm to about 50 µm, about 50 µm to about 70 µm, about 70 µm to about 90 µm, about 90 µm to about 110 µm, about 110 µm to about 130 µm, about 130 µm to about 150 µm, about 20 µm, about 50 µm, or about 120 µm.

In some embodiments, the printed matrix has a particle diameter of about 2 µm to about 60 µm, about 2 µm to about 20 µm, about 20 µm to about 40 µm, about 40 µm to about 60 µm, about 2 µm to about 10 µm, µm 5 to about 15 µm, about 10 µm to about 20 µm, about 20 µm to about 55 µm, about 30 µm to about 40 µm, about 40 µm to about 50 µm, about 45 µm to about 60 µm about 50 µm to about 60 µm, about 5 µm, about 10 µm, or about 50 µm. In some embodiments, the printed matrix may include pores having a diameter of about 1 µm to about 25 µm, about 1 µm to about 8 µm, about 8 µm to about 16 µm, about 16 µm to about 24 µm, about 1 µm to about 5 µm, about 5 µm to about 10 µm, about 10 µm to about 15 µm, about 15 µm to about 20 µm, about 20 µm to about 25 µm, about 2 µm to about 4 µm, about 1 µm to about 3 µm, about 14 µm to about 16 µm, about 2 µm, about 3 µm, or about 15 µm.

In some embodiments, the sacrificial powder includes a particle diameter of about 80 µm and a pore diameter of about 50 µm, while the printed matrix includes a particle diameter of about 10 µm and a pore diameter of about 3 µm. In some embodiments, the sacrificial powder includes a particle diameter of about 200 µm and a pore diameter of about 120 µm, while the printed matrix includes a particle diameter of about 50 µm and a pore diameter of about 15 µm. In some embodiments, the sacrificial powder includes a particle diameter of about 30 µm and a pore diameter of about 20 µm, while the printed matrix includes a particle diameter of about 5 µm and a pore diameter of about 2 µm.

Accordingly, in some embodiments, the sacrificial powder has a particle diameter greater than the pore diameter of the sacrificial powder, such as sacrificial powder particle diameter about 1.1 times, about 1.2 times, about 1.3 times, about 1.4 times, about 1.5 times, about 1.6 times, about 1.7 times, about 1.8 times, about 1.9 times, or about 2 times greater than the pore diameter of the sacrificial powder. In some embodiments, the printed matrix has a particle diameter greater than the pore diameter of the printed matrix, such as a printed matrix particle diameter about 2 times, about 2.5 times, about 3 times, about 3.5 times, or about 4 times greater than the pore diameter of the printed matrix. In some embodiments, the pore diameter of the sacrificial powder is greater than the pore diameter of the printed matrix, such as the pore diameter of the sacrificial powder being about 5 times to about 25 times, about 5 times to about 10 times, about 10 times to about 15 times, about 15 times to about 20 times, or about 20 times to about 25 times greater than the pore diameter of the printed matrix. In some embodiments, width or diameter of the microchannel is greater than the pore diameter of the sacrificial powder, such as the width or diameter of the microchannel being at least about 5 times, at least about 10 times, about 5 times to about 10 times, about 10 times to about 15 times, about 5 times to about 7 times, about 7 times to about 9 times, about 9 times to about 11 times, about 11 times to about 13 times, or about 13 times to about 15 times greater than the pore diameter of the sacrificial powder.

The cylinder 200 (including the sacrificial powder 215) is then positioned in a container 250 (e.g., crucible) proximate the infiltrant 260, as shown in the cross-sectional view of FIG. 2D. During infiltration processing, after the infiltrant 260 fills the porous printed matrix, excess infiltrant then fills the sacrificial powder 215 instead of the microchannels 220. In some embodiments, local pressure also can be controlled, thereby reducing the impact of pressure variations across the metallic structure.

FIG. 3 is an image of a milled sample post-infiltration taken from square 3 of FIG. 2D. FIG. 3 shows a fully dense printed matrix 270 that is infiltrated with bronze such that the fully dense printed matrix 270 is substantially devoid of pores (e.g., there are substantially no pores in the fully dense printed matrix 270 or pores are substantially absent from the fully dense printed matrix 270), semi-porous sacrificial powder 280 in a solid form after infiltration processing, pores 290 present in the semi-porous sacrificial powder 280 in the solid form, and an unfilled 700 µm microchannel 220 defined by the fully dense printed matrix 270.

Figure 4:
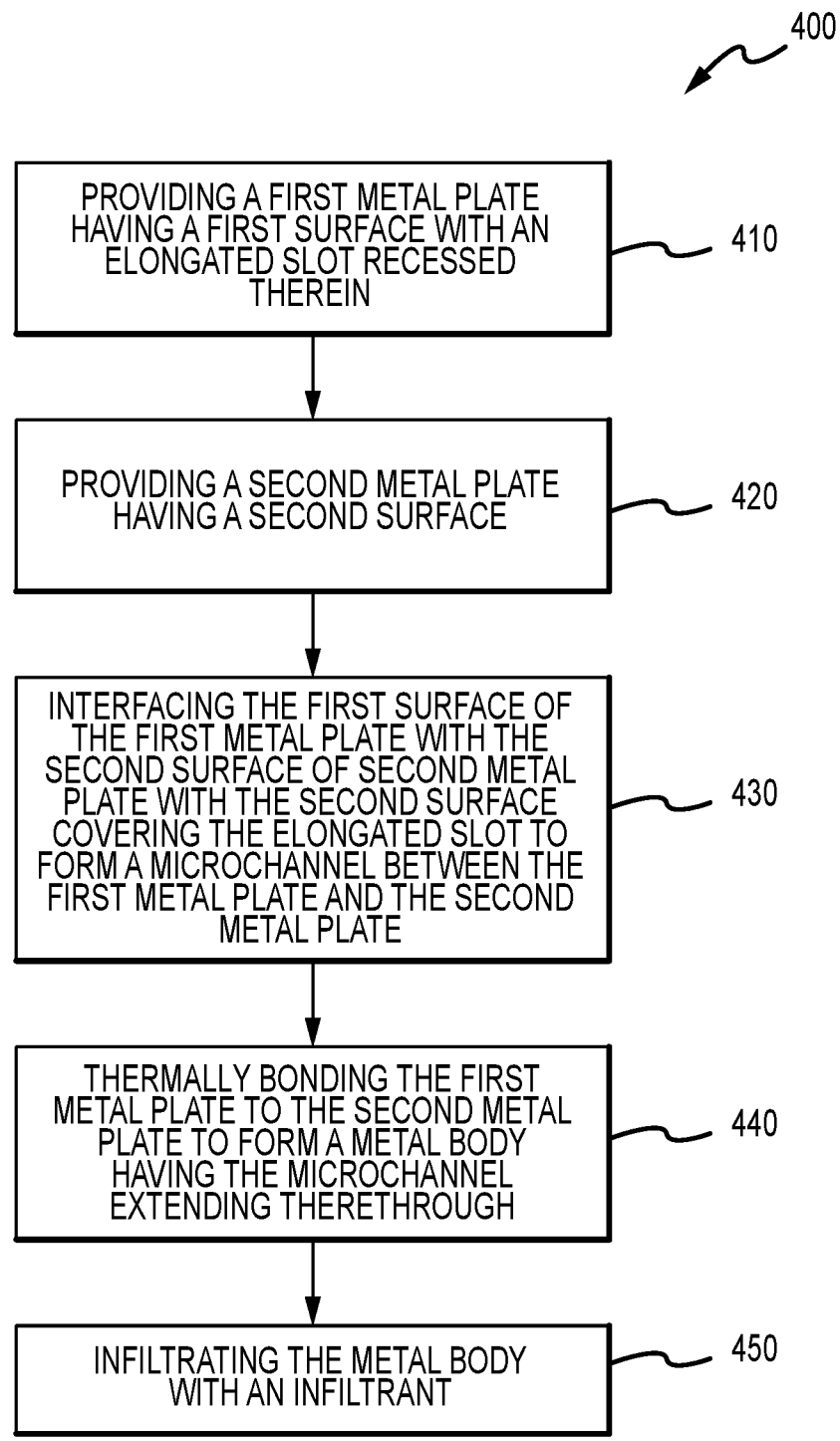
FIG. 4 is a flow diagram of a method for fabricating a microchannel in metal, according to an embodiment.
Figure 5A:
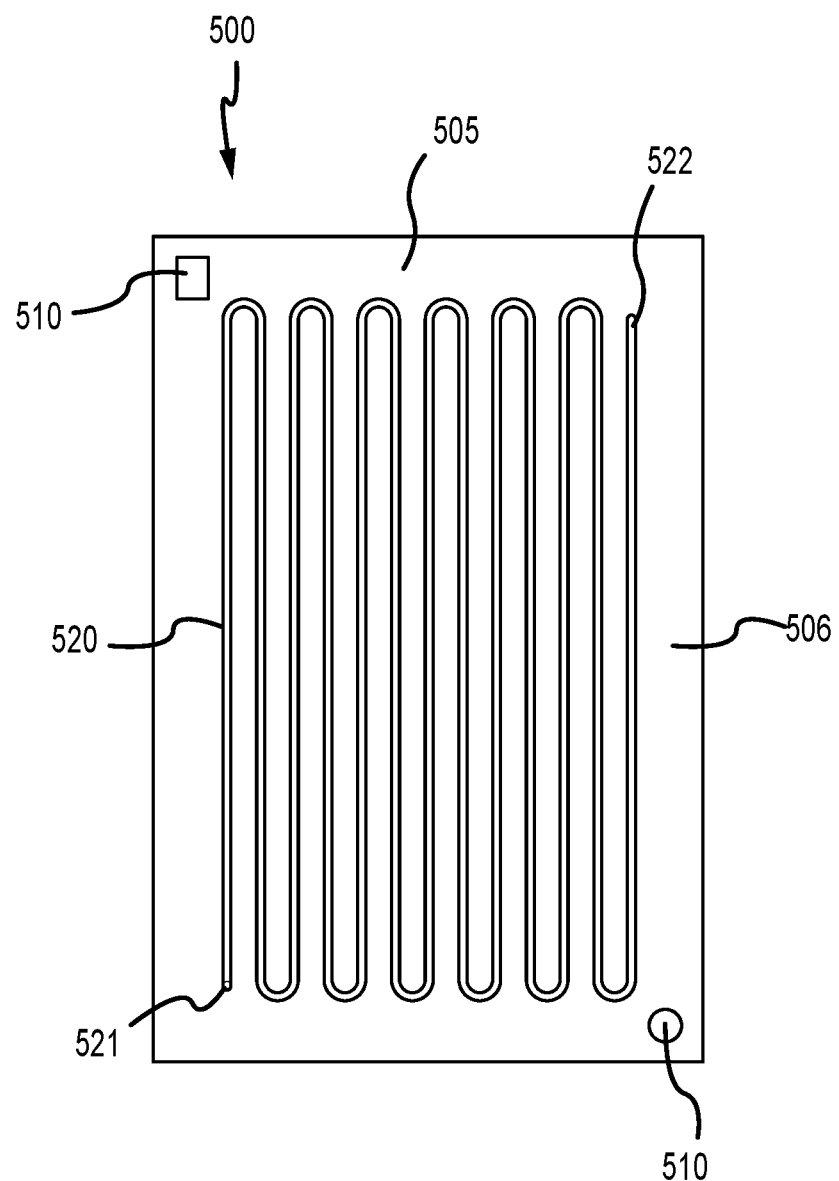
FIG. 5A is a metallic plate including an elongated slot, according to an embodiment.
Figure 5B:
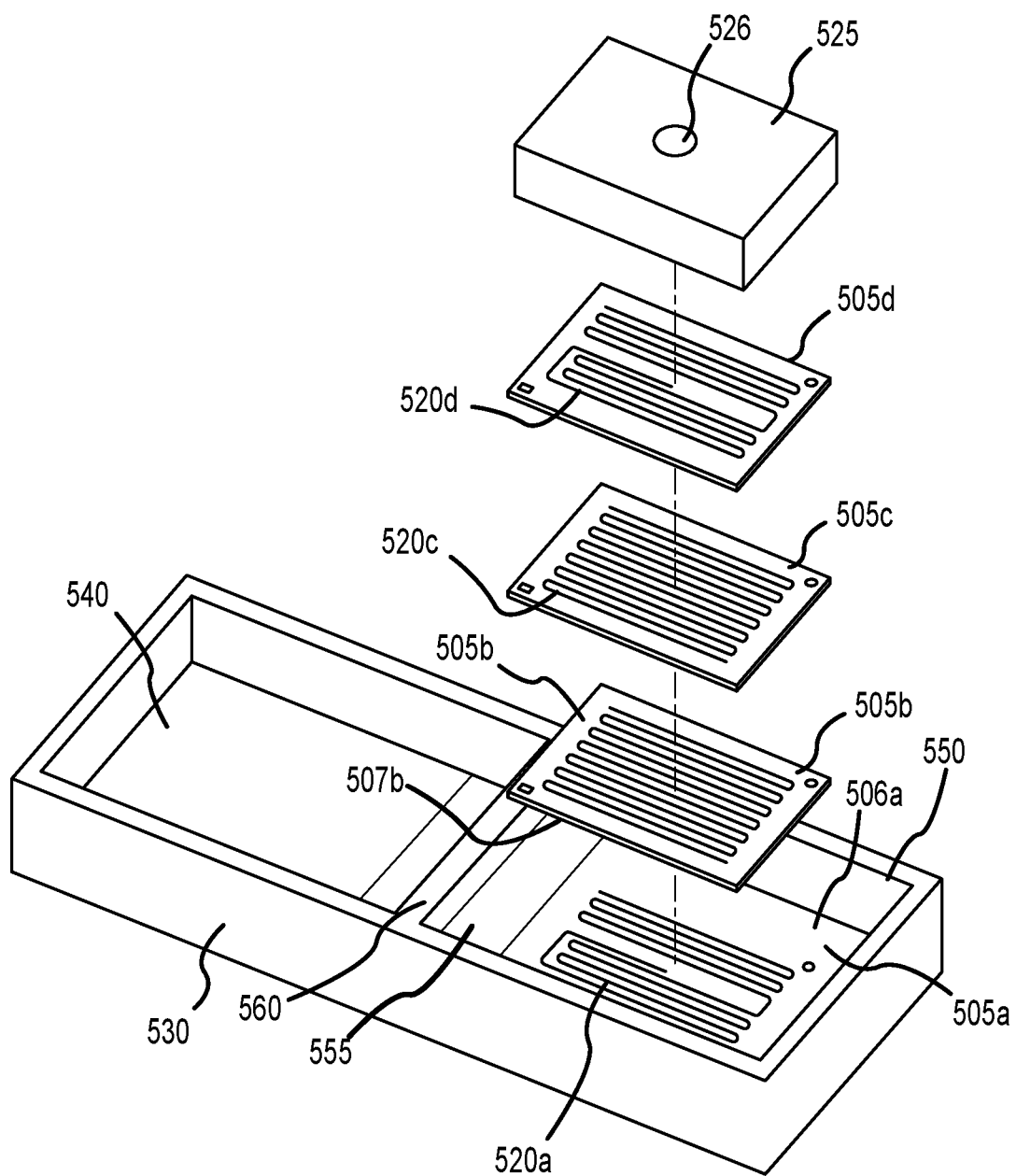
FIG. 5B is an exploded view of an assembly for sintering and/or infiltrating metallic plates to form a metallic body including a microchannel, according to an embodiment.

FIG. 4 is a flowchart of a method 400 of manufacturing or fabricating a microfluidic device, according to an embodiment. FIG. 5A and FIG. 5B show an assembly 500 in various acts or steps of the method 400. Each of FIGS. 4, 5A, and 5B are referred to below. In an embodiment, a method 400 for fabricating a microchannel in metal includes an act 410 of providing a first metallic plate 505a having a first surface 506a with an elongated slot 520a recessed therein. The method 400 also includes an act 420 of providing a second metallic plate 505b having a second surface 507b. The method 400 also includes an act of interfacing the first surface 506 of the first metallic plate 505a with the second surface 507b of the second metallic plate 505b with the second surface 507b covering the elongated slot 520a to form a microchannel between the first metallic plate 505a and the second metallic plate 505b. The method 400 also includes an act 430 of interfacing (e.g., stacking) the first surface of the first metallic plate with the second surface of the second metallic plate with the second surface effective to cover the elongated slot to form a microchannel between the first metallic plate and the second metallic plate. The method 400 also may include an act 440 of thermally bonding the first metallic plate 505a to the second metallic plate 505b to form a metallic body having the microchannel extending therethrough. Thermal bonding may include one or more of sintering, brazing, soldering, and/or combinations thereof. The method 400 also includes an act 450 of infiltrating the metallic body with an infiltrant. Acts of the method 400 are for illustrative purposes. For example, the acts of the method 400 may be performed in different orders, split into multiple acts, modified, supplemented, or combined.

In some embodiments, the acts 410 and 420 of providing the first metallic plate 505a and the second metallic plate 505b may include 3D printing the first metallic plate 505a and the second metallic plate 505b. The metallic plate 505 may be 3D printed with a metallic material according to any of the 3D printing processes provided herein. In some embodiments, the metallic plate 505 is binder jet 3D printed with a stainless steel material. In some embodiments, metallic plates 505 may be a metal, an alloy, or a composite thereof. In some embodiments, the materials of the metallic plates 505 and the infiltrant may include any materials (e.g., metallic materials) wherein the infiltrant has a lower melting point than the metallic plates 505. In some embodiments, after printing and curing the metallic plate 505, loose powder may be removed from elongated slot using brushes and compressed air.

FIG. 5A shows an example of a metallic plate 505 provided by 3D printing. The metallic plate 505 may include any of the multiple plates (e.g., the first metallic plate 505a, the second metallic plate 505b, the third metallic plate 505c, or the fourth metallic plate 505d) stacked on one another to form the metallic body. The metallic plate 505 is printed or otherwise formed to include an elongated channel recessed into a surface 506 of the metallic plate 505. In some embodiments, the elongated slot 420 is at least about 10 mm, at least about 15 mm, at least about 20 mm, at least about 25 mm, at least about 30 mm, at least about 35 mm, at least about 40 mm, at least about 45 mm, or at least about 50 mm in length in the metallic plate 505. The elongated slot 420 may have a maximum width of about 1000 µm or less, less than about 900 µm, less than about 800 µm, less than about 700 µm, less than about 600 µm, less than about 500 µm, less than about 450 µm, less than about 400 µm, less than about 350 µm, less than about 300 µm, less than about 250 µm, less than about 200 µm, less than about 150 µm, less than about 100 µm, less than about 75 µm, less than about 50 µm, less than about 25 µm, less than about 15 µm, about 10 µm to about 1000 µm, about 10 µm to about 100 µm, about 100 µm to about 250 µm, about 250 µm to about 750 µm, about 500 µm to about 1000 µm, about 250 µm to about 500 µm, about 500 µm to about 750 µm, about 750 µm to about 1000 µm, about 300 µm to about 400 µm, about 400 µm to about 500 µm, about 500 µm to about 600 µm, about 600 µm to about 700 µm, about 700 µm to about 800 µm, about 800 µm to about 900 µm, or about 900 µm to about 1000 µm. In some embodiments, the elongated slot may include a non-circular or non-semi-circular shape, and may include cross-sectional width of about 10 µm to about 50 µm.

The elongated slot 520 in the surface 506 may be generally semi-circular (e.g., half-circular) or polygonal (e.g., triangular, square, rectangular) in cross-sectional shape. The metallic plate 505 also may be formed (e.g., printed) to include a second or additional surface (not shown in FIG. 5A) opposite to the surface 506. The second surface of the metallic plate 505 may be substantially planar, smooth, or flat (e.g., a slot is absent from the second surface of the metallic plate 505). In some embodiments, however, the second surface 505 may include an elongated slot disposed on the second surface complementary to an elongated slot 520 on the first surface 506 of an additional metallic plate 505 on which the metallic plate 505 is stacked.

The metallic plate 505 also may include (e.g., define) an inlet 521 in fluid communication with the elongated slot 520 when another plate is stacked on the metallic plate 505. In some embodiments, the inlet 521 extends through the metallic plate 505 from the elongated slot 520 to the second surface (e.g., the second surface at least partially defines the inlet). The inlet 521 may be spaced from an edge of the metallic plate 505 and positioned to align with a terminating end 522 of an elongated slot 520 of an adjacent additional metallic plate 505 on which the metallic plate is stacked. In some embodiments, the inlet 521 is positioned at a terminating end of the elongated slot 520. In some embodiments, the inlet 521 is positioned at an edge of the metallic plate 505, and the inlet 521 may serve as the inlet for the entire microchannel of the final metallic structure. In some embodiments, the elongated slot 520 extends to an edge of the metallic plate 505 to serve as an outlet for the entire microchannel of the final metallic structure.

The elongated slot 520 may extend two-dimensionally on the metallic plate 505 from the inlet 521 to the opposing terminating end. For example, on the metallic plate 505 shown in FIG. 5A, the elongated slot 520 extends in a first dimension between the top and bottom of the metallic plate 520 as viewed in FIG. 5A and also extends in a second dimension between the left and right of the metallic plate 520 as viewed in FIG. 5A. Said another way, the elongated slot 520 may extend at least bi-directionally on a theoretical grid of the surface 506 of the metallic plate.

The metallic plate 505 also may include one or more alignment markers 510 or features. The one or more alignment markers 510 may be positioned to align with one or more alignment markers of additional adjacent metallic plates 505 on which the metallic plate 505 is stacked or are stacked on the metallic plate 505. The alignment marker 510 may include a protrusion and/or a recess in the surface 506 (and/or the second surface) of the metallic plate. For example, the metallic plate 505 may include a protruding alignment marker 510 positioned to align with a recessed alignment marker in the surface of an adjacent second metallic plate 505. The metallic plate 505 also may include a recessed alignment marker 510 positioned to aligned with a protruding alignment marker in the surface of an adjacent second metallic plate 505.

In some embodiments, the method 400 also may include disposing a metallic lid plate over the first metallic plate and the second metallic plate with the second metallic plate being positioned between the first metallic plate and the second metallic plate before thermally bonding and infiltrating the metallic plates. For example, FIG. 5B shows an exploded view of an assembly including the metallic plates 505*a*-*d* and a metallic lid plate 525. The metallic lid plate 525 includes or defines an opening 526 that is in fluid communication with elongated slot of each of the metallic plates 505*a*-*d* when the metallic lid plate is stacked on the metallic plates 505*a*-*d*. For example, when (1) the first surface 506*a* of the first metallic plate 505*a* is interfacing with the second surface 507*b* of the second metallic plate 505*b* with the second surface 507*b* and (2) the metallic lid plate 525 is disposed over the first metallic plate 505*a* and the second metallic plate 505*b*, the opening 526 on the metallic lid plate 525 is in fluid communication with the elongated slot 520*a* in the first surface 506*a* of the first metallic plate 505*a* via at least the inlet 521 (not visible in FIG. 4B) in the second metallic plate 505*b* positioned proximate to a terminating end region of the elongated slot 520*b*. In these and other embodiments, the act 440 of thermally bonding the first metallic plate 505*a* to the second plate 505*b* may include sintering the first metallic plate 505*a*, the second metallic plate 505*b*, and the metallic lid plate 525 together to form the metallic body having the microchannel extending therethrough with the opening 526 on the metallic lid plate 525 in fluid communication with the microchannel. In some embodiments, the act 440 of thermally bonding may include one or more of sintering, brazing, soldering, and/or combinations thereof.

In some embodiments, the method 400 also may include an act of disposing an additional metallic plate over the first metallic plate and the second metallic plate such that the additional metallic plate is between the second metallic plate and the metallic lid plate. For example, FIG. 5B shows an exploded view of an assembly including four metallic plates 505*a*-*d*. Each of the metallic plates 505*a*-*d* may include an elongated slot 520*a*-*d*. When (1) the first surface 506*a* of the first metallic plate 505*a* is interfacing with the second surface 507*b* of the second metallic plate 505*b* with the second surface 507*b*, and (2) the metallic lid plate 525 is disposed over the first metallic plate 505*a* and the second metallic plate 505*b* with the additional metallic plate(s) 505*c*-*d* positioned between the metallic lid plate 525 and the second metallic plate 505*b*, the additional elongated slot(s) 520*c*-*d* are in fluid communication with the opening 526 in the metallic lid plate 525 and also the elongated slot 520*a* of the first metallic plate 505*a*, according to an embodiment. In these and other embodiments, the act 440 of thermally bonding the first metallic plate 505*a* to the second plate 505*b* may include sintering the first metallic plate 505*a*, the second metallic plate 505*b*, the additional metallic plate(s) 505*c*-*d*, and the metallic lid plate 525 together to form the metallic body having the microchannel including at least the elongated slot 520*a* and the additional elongated slot(s) 520*b*-*d* extending therethrough with the opening 526 on the metallic lid plate 525 in fluid communication with the microchannel. When the metallic plates 505*a*-*d* are sintered together and a microchannel is formed from the elongated slots 520*a*-*d* in the metallic plates 505*a*-*d*, the formed microchannel extends three-dimensionally within the metallic body formed from the sintered metallic plates 505*a*-*d*. For example, the microchannel may (1) extend at least partially between a first side surface region of the metallic body and a second side surface region of the metallic body opposite to the first side surface region, (2) extend at least partially between a third side surface region of the metallic body extending at least partially between the first side surface region and the second side surface region and a fourth side surface region opposite to the third side surface region, and (3) extend at least partially between an upper surface region (e.g., a region that includes metallic plate 505*d*) of the metallic body and a bottom surface region (e.g., a region that includes metallic plate 505*a*) of the metallic body opposite to the upper surface region.

In some embodiments, the act 440 of thermally bonding the first metallic plate to the second metallic plate to form a metallic body having the microchannel extending therethrough may include sintering the first metallic plate 505*a* to the second metallic plate 505*b* (and any additional metallic plates 505*c*-*d* and/or the metallic lid plate 525) at a predetermined temperature for a predetermined time in a selected atmosphere to form the metallic body having the microchannel extending therethrough. In some embodiments, during sintering and infiltration, samples (e.g., metallic plates) are inserted into the heating zone and a transfer arm is sealed with PVC tubing using hose clamps to minimize oxygen diffusion into furnace. After sintering or infiltration, samples may be rapidly cooled by unsealing the transfer arm and pulling them out to the cooling zone.

In some embodiments, the metallic plates 505*a-d* and the metallic lid plate 525 may be thermally bonded (e.g., sintered, brazed, and/or soldered) at a predetermined temperature of at least about 600° C., at least about 700° C., at least about 800° C., at least about 900° C., at least about 1000° C., about 600° C. to about 1000° C., about 600° C. to about 800° C., about 800° C. to about 1000° C., about 600° C. to about 700° C., about 700° C. to about 800° C., about 800° C. to about 900° C., or about 900° C. to about 1000° C. The temperature may be increased from room temperature to the predetermined temperature at a rate of about 10° C./min to about 15° C./min, about 12° C./min to about 14° C./min, about 10° C./min, about 11° C./min, about 12° C./min, about 13° C./min, about 14° C./min, or about 15° C./min. The act 440 of thermally bonding the first metallic plate to the second metallic plate (and any additional metallic plates) forms a metallurgical bond between the metal plates. In some embodiments, the method 400 may include holding the metallic plates at the predetermined temperature for a predetermined amount of time that may include at least about 20 minutes, at least about 30 minutes, at least about 45 minutes, at least about one hour, at least about 1.5 hours, or at least about 2 hours. Holding the metallic plates at the predetermined temperature for the predetermined amount of time may allow for binder burnout.

In some embodiments, the act 440 of thermally bonding the first metallic plate to the second metallic plate to form a metallic body having the microchannel extending therethrough may include sintering the first metallic plate 505*a* to the second metallic plate 505*b* (and any additional metallic plates 505*c-d* and/or the metallic lid plate 525) at the predetermined temperature for the predetermined time, and then at a second predetermined temperature for a second predetermined amount of time. The second predetermined temperature may be at least about 800° C., at least about 900° C., at least about 1000° C., at least about 1100° C., at least about 1200° C., 800° C. to about 1400° C., about 800° C. to about 1000° C., about 1000° C. to about 1200° C., about 1200° C. to about 1400° C., about 800° C. to about 900° C., about 900° C. to about 1000° C., about 1000° C. to about 1100° C., about 1050° C. to about 1150° C., about 1100° C. to about 1200° C., about 1200° C. to about 1300° C., or about 1300° C. to about 1400° C. The temperature may be increased to the second predetermined temperature at a rate of about 3° C./min to about 10° C./min, about 4° C./min to about 8° C./min, about 4° C./min, about 5° C./min, about 6° C./min, about 7° C./min, about 8° C./min, or about 9° C./min.

In some embodiments, the predetermined temperature (and/or the second predetermined temperature) for the act 440 of thermally bonding is less than the melting temperature of the metallic plate, such as about 0.6 to about 0.95, about 0.6 to about 0.7, about 0.7 to about 0.8, about 0.75 to about 0.85, about 0.8 to about 0.9, about 0.85 to about 0.95, about 0.7 to about 0.75, about 0.8, about 0.85 to about 0.9, or about 0.95 of the absolute melting temperature of the material of the metallic plate.

In some embodiments, the method 400 may include holding the metallic plates at the second predetermined temperature for the second predetermined amount of time that may include at least about 5 minutes, at least about 10 minutes, at least about 15 minutes, at least about 20 minutes, at least about 30 minutes, or at least about 45 minutes. Holding the metallic plates at the predetermined temperature for the predetermined amount of time may allow for binder burnout.

In some embodiments, the act 440 of thermally bonding the first metallic plate to the second metallic plate to form a metallic body having the microchannel extending therethrough may include sintering the first metallic plate 505*a* to the second metallic plate 505*b* (and any additional metallic plates 505*c-d* and/or the metallic lid plate 525) in a preselected atmosphere. The preselected atmosphere may include at least one (e.g., both) of hydrogen and argon. In some embodiments, the during the final selected minutes of the predetermined amount of time and/or the second predetermined amount of time, hydrogen flow may be stopped and argon flow may be increased to a predetermined rate to flush hydrogen from the tube. The predetermine rate of flow of the argon may be about 1000 SCCM to about 2000 SCCM, about 1200 SCCM to about 1600 SCCM, about 1100 SCCM to about 1300 SCCM, about 1300 SCCM to about 1500 SCCM, or about 1500 SCCM to about 1700 SCCM.

The method 400 may then include rapidly cooling the metallic plates to a cooling zone of about 100° C. to about 300° C., about 150° C. to about 250° C. or about 200° C. The method 400 may further include leaving the metallic plates in the cooling zone, still under the flow of argon, for at least about 10 minutes, at least about 15 minutes, at least about 20 minutes, or at least about 30 minutes.

In some embodiments, the method 400 further comprises disposing a weight on the metallic plates 505*a-d* and/or the metallic lid plate 525 before sintering the metallic plates together. For example, a weight of at least about 50 g, at least about 100 g, at least about 150 g, at least about 200 g, at least about 250 g, about 100 g to about 250 g, about 50 g to about 100 g, about 100 g to about 150 g, about 150 g to about 200 g, or about 200 g to about 250 g.

In some embodiments, the act 440 of thermally bonding the first metallic plate to the second metallic plate (and/or any additional metallic plates) may include an act of high-temperature sintering the metallic plates to one another, and the act 450 of infiltrating the metallic body with the infiltrant may be absent from the method. In some embodiments, the act 440 includes thermally bonding the first metallic plate to the second metallic plate at a predetermined temperature of at least about 1250° C., at least about 1300° C., at least about 1350° C., at least about 1400° C., at least about 1450° C., at least about 1500° C., about 1250° C. to about 1500° C., about 1250° C. to about 1350° C., or about 1350° C. to about 1450° C.

In some embodiments, the act 450 of infiltrating the metallic body with an infiltrant includes infiltrating the metallic body with the infiltrant in the presence of a sacrificial powder. The infiltrant may include a bronze powder, a copper powder, a zinc powder, tin and/or combinations or alloys thereof. The material of the metallic plates may include a stainless steel powder, a titanium alloy powder, a ceramic powder, or combinations thereof. The material of the sacrificial powder may include porous metals such as stainless steel, copper, and/or titanium, and/or porous ceramics. For example, in some embodiments, the metallic plate may be formed (e.g., printed) from a stainless steel material (e.g. powder), and the infiltrant may include a bronze infiltrant. In some embodiments, the metallic plate may be formed from a stainless steel material, and the infiltrant may include a copper infiltrant. In some embodiments, the metallic plate may be formed from a titanium alloy material, and the infiltrant may include a copper infiltrant. In some embodiments, the plate may be formed from a ceramic powder, and the infiltrant may include any material that wets to the ceramic powder. In some embodiments, the infiltrant may be a solid rather than a powder.

In some embodiments, infiltrating the metallic body with the infiltrant in the presence of a sacrificial powder includes infiltrating the metallic body with the infiltrant in the presence of a sacrificial powder at a predetermined time and a predetermined temperature to melt at least the infiltrant. The predetermined temperature of infiltration may be at least about 800° C., at least about 900° C., at least about 1000° C., at least about 1100° C., at least about 1200° C., 800° C. to about 1400° C., about 800° C. to about 1000° C., about 1000° C. to about 1200° C., about 1200° C. to about 1400° C., about 800° C. to about 900° C., about 900° C. to about 1000° C., about 1000° C. to about 1100° C., about 1050° C. to about 1150° C., about 1100° C. to about 1200° C., about 1200° C. to about 1300° C., or about 1300° C. to about 1400° C. The predetermined time of infiltration may be at least about 2 hours, at least about 3 hours, at least about 4 hours, at least about 5 hours, at least about 6 hours, at least about 7 hours, about 2 hours to about 8 hours, about 2 hours to about 5 hours, about 5 hours to about 8 hours, about 2 hours to about 4 hours, about 4 hours to about 6 hours, about 6 hours to about 8 hours, about 2 hours to about 3 hours, about 3 hours to about 4 hours, about 4 hours to about 5 hours, about 5 hours to about 6 hours, about 6 hours to about 7 hours, or about 7 hours to about 8 hours.

In some embodiments, the act 450 of infiltrating the metallic body with an infiltrant includes may include infiltrating the metallic body with the infiltrant in a preselected atmosphere. The preselected atmosphere may include at least one (e.g., both) of hydrogen and argon. In some embodiments, atmospheres during infiltration may include one or more of argon mixed with hydrogen, a vacuum (e.g., negative pressure) atmosphere, one or more inert gasses mixed with hydrogen or another reducing gas, and/or a purely hydrogen environment. For example, the method may include first flowing argon into the furnace to flush air from the tube, and then transitioning the metallic body to the heating zone in the presence of a second flow argon and hydrogen. The first flow of argon may about may be about 1000 SCCM to about 2000 SCCM, about 1200 SCCM to about 1600 SCCM, about 1100 SCCM to about 1300 SCCM, about 1300 SCCM to about 1500 SCCM, or about 1500 SCCM to about 1700 SCCM. The second flow of argon may be about may be about 400 SCCM to about 1000 SCCM, about 400 SCCM to about 700 SCCM, about 700 SCCM to about 1000 SCCM, about 600 SCCM to about 800 SCCM, or about 650 SCCM to about 750 SCCM. The flow of oxygen may be at least about 100 SCCM, at least about 200 SCCM, at least about 300 SCCM, about 100 SCCM to about 300 SCCM, or about 150 SCCM to about 250 SCCM.

The method 400 may then include rapidly cooling the metallic body as infiltrated to a cooling zone of about 100° C. to about 300° C., about 150° C. to about 250° C. or about 200° C. The method 400 may further include leaving the metallic plates in the cooling zone, still under the flow of argon, for at least about 10 minutes, at least about 15 minutes, at least about 20 minutes, or at least about 30 minutes.

In some embodiments, the act 450 of infiltrating the metallic body with an infiltrant includes infiltrating the metallic body with the infiltrant in the presence of a sacrificial powder at a predetermine pressure of about −1 kPa or less. Infiltration at the negative pressure keeps the microchannel free of infiltrant during the act of infiltrating the metallic body (e.g., the infiltrant is substantially absent from the microchannel and/or the microchannel is substantially devoid of the infiltrant). In some embodiments, the predetermined pressure during infiltration is about −1 kPa to about −100 kPa, about −1 kPa to about −50 kPa, about −50 kPa to about −100 kPa, about −1 kPa to about −25 kPa, about −25 kPa to about −50 kPa, about −50 kPa to about −75 kPa, or about −75 kPa to about −100 kPa. In some embodiments, the predetermined pressure may be correlated or correspond to a width of the microchannel in the metallic body being infiltrated. For example, if the width or diameter of elongated slot or microchannel is less than 1000 µm, then the pressure will be less than about −1 kPa. If the width or diameter of elongated slot or microchannel is about 50 µm, the pressure will be less than about −50 kPa. In some embodiments, the predetermined pressure is significantly lower than a corresponding width of the microchannel in the metallic body being infiltrated. For example, a pressure of −40 kPa may be used to keep a 1000 µm free of infiltrant.

In some embodiments, the method 400 may include, before infiltrating the body with the infiltrant in the presence of a sacrificial powder, disposing the sacrificial powder adjacent the metallic body and disposing the infiltrant with the sacrificial powder between the infiltrant and the metallic body. For example, FIG. 5B shows a support 530 that may include a region 550 that holds the metallic plates 505a-d and the sacrificial powder. When the metallic plates are positioned in the region 550, a compartment 555 may be formed between the metallic plates 505a-d and a divider 560, and the sacrificial powder may be disposed in this compartment. The support 530 also may include a basin 540 for holding the infiltrant, with the divider 560 being disposed between the compartment 550 for sacrificial powder and the basin 540 for the infiltrant.

The act of infiltrating the metallic body in the presence of the sacrificial may form a metallic structure that includes a first region and a second region. For example, FIG. 6B is a cross-sectional view of a microfluidic device 600 formed according to one or more embodiments of the method 400. The microfluidic device 600 includes a first region 670 at least partially (e.g., entirely) defines the microchannel 620 and is substantially devoid of pores 690. The microfluidic device 600 also includes a second region 680 that includes at least a portion of the solidified sacrificial powder and that is spaced from the microchannel 620 by the first region 670. The second region 680 typically includes one or more pores 690.

The resulting microchannel formed in the metallic structure (e.g., microfluidic device may have a maximum width of about 1000 µm or less, less than about 900 µm, less than about 800 µm, less than about 700 µm, less than about 600 µm, less than about 500 µm, less than about 450 µm, less than about 400 µm, less than about 350 µm, less than about 300 µm, less than about 250 µm, less than about 200 µm, less than about 150 µm, less than about 100 µm, less than about 75 µm, less than about 50 µm, less than about 25 µm, less than about 15 µm, about 10 µm to about 1000 µm, about 10 µm to about 100 µm, about 100 µm to about 250 µm, about 250 µm to about 750 µm, about 500 µm to about 1000 µm, about 250 µm to about 500 µm, about 500 µm to about 750 µm, about 750 µm to about 1000 µm, about 300 µm to about 400 µm, about 400 µm to about 500 µm, about 500 µm to about 600 µm, about 600 µm to about 700 µm, about 700 µm to about 800 µm, about 800 µm to about 900 µm, or about 900 µm to about 1000 µm. In some embodiments, the micro-channel may include a non-circular or non-semi-circular shape, and may include cross-sectional width of about 10 µm to about 50 µm.

Figure 6A:
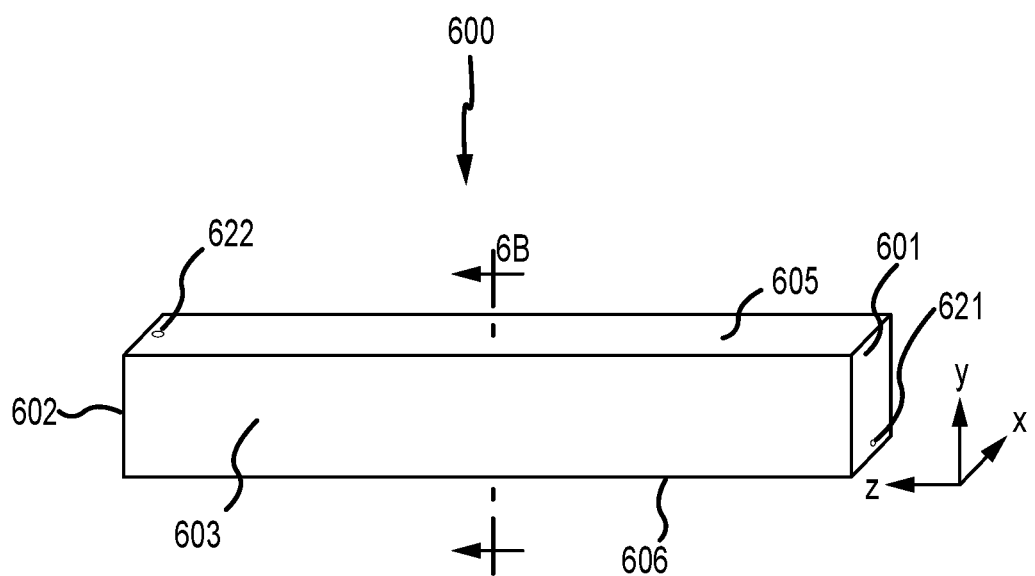
FIG. 6A is an isometric view of a metallic structure of a microfluidic device, according to an embodiment.
Figure 6B:
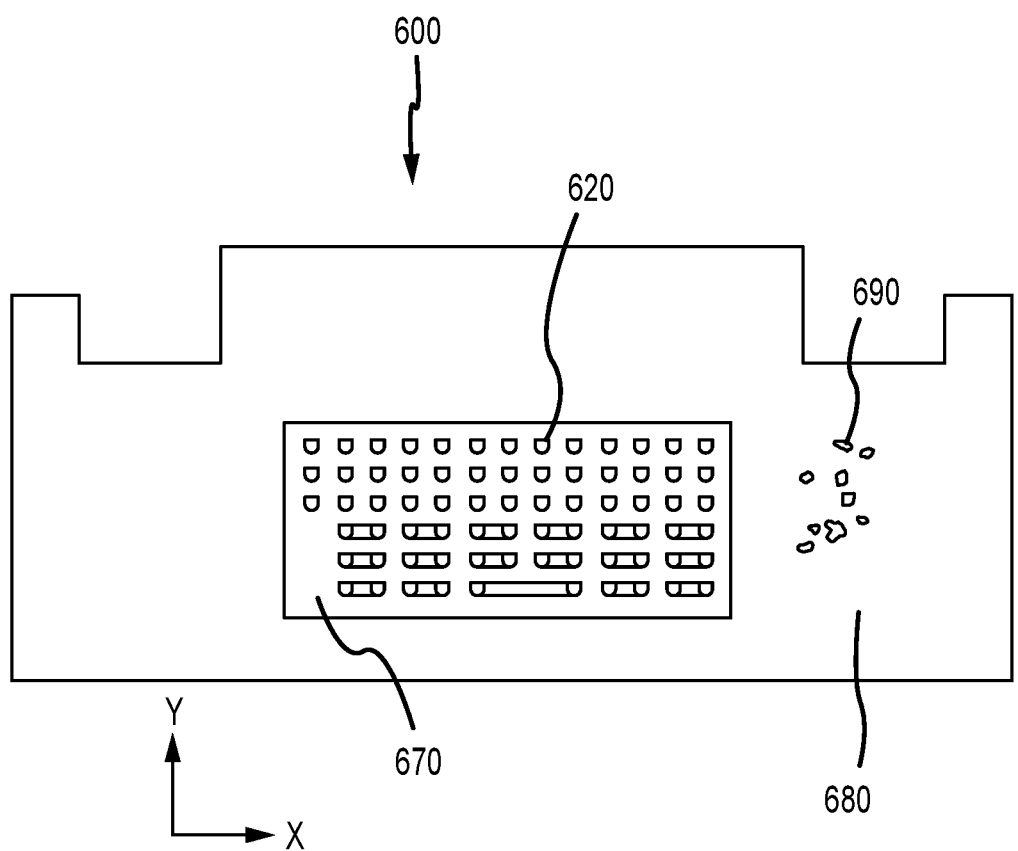
FIG. 6B is a cross-sectional view of the metallic structure of FIG. 6A.

FIG. 6A is an isometric view of a microfluidic device 600 formed according to one or more embodiments of the systems and methods described herein, and FIG. 6B is a cross-sectional view of the microfluidic device 600 of FIG. 6A. The microfluidic device 600 may include a micro gas chromatography device for use in a micro gas chromatography system or may include a micro heat exchanger. When used in a micro gas chromatography system, the microchannel may be coated with a coating, such as silica or other suitable for surface deactivation.

In some embodiments, the microfluidic device 600 includes a metallic structure having multiple surface regions including a first side surface region 601, a second side surface region 602 opposite to the first side surface region 601, a third side surface region 603 extending at least partially between the first side surface region 601 and the second side surface region 602, a fourth side surface region 604 opposite to the third side surface region 603 and extending at least partially between the first side surface region 601 and the second side surface region 602, a bottom surface region 606 extending at least partially between the first side surface region 601 and the second side surface region 602, and an upper surface region 605 extending at least partially between the first side surface region 601 and the second side surface region 602. While each of the surface regions 601-606 are shown generally flat or planar surfaces in FIG. 6A, in some embodiments, one or more (e.g. multiple or all) surface regions 601-606 may be non-planar (e.g., curved). The one or more of the multiple surface regions 601-606 define an inlet 621 and an outlet 622. While the inlet 621 is disposed on the first surface region 601 and the outlet 622 is disposed on the upper surface region 605 in the embodiment shown in FIG. 6A, the inlet 621 and the outlet 622 may be disposed on any multiple surface regions 601-606, including the same surface region.

Turning to FIG. 6B, the microfluidic device 600 includes a microchannel 620 disposed within the metallic structure and extending between the inlet 621 and the outlet 622, according to an embodiment. The microchannel 620 has a lateral width or diameter of about 1000 µm or less. For example, the microchannel 620 may have a maximum width of about 1000 µm or less, less than about 900 µm, less than about 800 µm, less than about 700 µm, less than about 600 µm, less than about 500 µm, less than about 450 µm, less than about 400 µm, less than about 350 µm, less than about 300 µm, less than about 250 µm, less than about 200 µm, less than about 150 µm, less than about 100 µm, less than about 75 µm, less than about 50 µm, less than about 25 µm, less than about 15 µm, about 10 µm to about 1000 µm, about 10 µm to about 100 µm, about 100 µm to about 250 µm, about 250 µm to about 750 µm, about 500 µm to about 1000 µm, about 250 µm to about 500 µm, about 500 µm to about 750 µm, about 750 µm to about 1000 µm, about 300 µm to about 400 µm, about 400 µm to about 500 µm, about 500 µm to about 600 µm, about 600 µm to about 700 µm, about 700 µm to about 800 µm, about 800 µm to about 900 µm, or about 900 µm to about 1000 µm. In some embodiments, the microchannel 620 may include a non-circular or non-semi-circular shape, and may include cross-sectional width of about 10 µm to about 50 µm.

The microchannel 620 may extend three-dimensionally within the metallic structure of the microfluidic device 600. For example, the microchannel 620 may extend (1) at least partially between the first side surface region 601 and the second side surface region 602, (2) at least partially between the third side surface region 603 and the fourth side surface region 604, and (3) at least partially between the upper surface region 606 and the bottom surface region 605. Said another way, in some embodiments, the microchannel 620 extends at least partially along a first theoretical plane or grid axis x, at least partially along a second theoretical plane or grid axis y angled relative to the first theoretical plane, and at least partially along a third theoretical plane or grid axis z angled relative to the first theoretical plane and the second theoretical plane.

The microfluidic device 600 may include any of the materials described herein, such as a stainless steel structure at least partially infiltrated with bronze. In some embodiments, the microfluidic device 600 includes a first internal region 670 defining at least a portion (e.g., all) of the microchannel 620. The first internal region 670 may be substantially free or devoid of pores (e.g., pores are absent from the region of the microfluidic device 600 defining the microchannel 620). The first internal region 670 may include bronze-infiltrated stainless steel. In some embodiments, the microfluidic device 600 also includes a second internal region 680 spaced from the first internal region and including one or more pores 690. Thus, any pores 690 present in the microfluidic device are spaced from the microchannel 620.

Also described herein are methods for interfacing one or more metallic capillaries (e.g., pre-made metallic tubing) to a metallic microchannel, and resulting systems. The systems and methods may include any aspect of the systems and methods for fabricating metallic microchannels described herein. For example, a metallic structure (e.g., block or chip) formed according to systems and methods described herein may be interfaced with one or more metallic capillaries for use in a microfluidic system, such as micro-gas chromatography or a micro heat exchanger. Moreover, as shall be described in greater detail below, interfacing the one or more capillaries with the metallic microchannel may be performed simultaneously with formation of the metallic structure including the microchannel.

Gas chromatography (GC) is a process by which volatile molecules and compounds are separated for detection. Chemicals separable by GC can be found in food, fuel, weapons, and pharmaceuticals. The ability to separate and identify these volatile molecules has important applications in security, health, safety, and research. In GC, the distinct volatility and mass of different molecules is used to create separations between the molecules. An analyte, composed of volatile gasses or liquids, is heated and carried through a narrow (typically 250 µm diameter) channel by an innate gas such as helium or argon where it will dissolve into and out of a polymer coating called the stationary phase. Molecular interactions will determine the amount of time that a molecule spends in the stationary phase and thus how long it takes for the molecule to traverse the length of the channel. Separated analyte peaks exit the channel at different times. Various types of mass spectrometry or other analytical techniques detect the presence of the analyte at the exit while measuring additional molecular characteristics.

A challenge limiting the reach of GC in many applications is portability. The average length of a traditional gas chromatography column is between 30 and 100 meters long. Columns consisting of coiled quartz capillary are uniformly heated in convection ovens to facilitate separations. Because of the length and heating requirements most GC units are large and power intensive. The length of the column also means that analysis can take as long as an hour to perform.

These limitations on the mobility and speed of analysis have caused researchers to consider faster, smaller, and less power intensive chromatography systems, typically known as micro-GC.

Silicon has conventionally been used for fabricating micro-GC columns. While silicon has excellent thermal properties and extensively developed lithography and etching techniques, silicon suffers from limited geometric flexibility, brittleness, interfacing difficulty, and a limited channel length because the designs are confined to two dimensions. Columns are made in silicon by etching them on wafers using wet or dry etching techniques. These etched channels are then sealed by bonding a second wafer over the etched face. The cross-sectional geometry of these channels are entirely dependent on the etching technique. The cross-section of a wet etch is roughly a semi-circle and the cross-section of a dry etch tends to be rectangular. These geometries leave corners where the polymer stationary phase could pool and cause uneven separations. An additional challenge with silicon based micro-GC systems is the length of the columns. Micro-GC systems tend to have column lengths ranging from tens of centimeters up to a two or more meters—much less than the 30 to 100 meters of a standard GC system. Decreasing length from standard GC systems to micro-GC systems causes conventional micro-GC to suffer from comparatively poorer separations. Extending the length of a micro-GC column is difficult due to the constraints of working in only two dimensions on silicon wafers. Interfacing with the columns in silicon micro-GC systems is another challenge because silicon is brittle and not easy to machine or bond to. For these reasons, micro-GC is not as widely used as standard GC.

A unique approach which has the potential to overcome many of the challenges facing micro-GC, particularly systems etched in silicon, is 3D printing because of its geometric flexibility. This means that columns can have circular cross-sections which reduces the risk of uneven distribution of the stationary phase. A 3D printed channel is not confined to the 2D surface of a silicon wafer opening up the possibility of increasing the potential length of the column dramatically. While some lab-on-chip systems include 3D printed capillaries, these systems are typically printed in low temperature polymers, which are unacceptable for GC. These polymers are unstable to withstand temperature cycling from room temperature to 300° C., which is necessary for good separations, making them a poor choice for micro-GC.

While many 3D printing technologies are specific to polymers, binder jet printing is a method which can print in metals. Metals have high thermal conductivity and can undergo thermal cycling. Binder jet printing uses uniform layers of powder, upon which is deposited a polymer glue. The glue solidifies through the layers to create a "green" part. The green part is left in the bed of powder until the glue is cured. It is then removed and sintered. The heat of the sintering burns out the polymer. The final product has many of the bulk properties of the powder metal. In some embodiments (such as embodiments of the method 400), stainless steel was 3D printed to achieve a metallic structure which is not brittle, can withstand a large range of temperatures, has high thermal conductivity, and is easy to machine. These features make the resulting structure an ideal choice for creating columns for GC and/or micro heat exchanger systems.

One challenge facing micro-GC and micro heat exchangers is the method of interfacing between the capillary and the microchannel (e.g., column). An improper interface can introduce impurities or disrupt the signal. In standard GC, graphite ferrules are used to seal around quartz capillaries. Graphite is desirable in standard GC as a sealant because it will not absorb the analyte. The molecules that make up the analyte are volatile molecules and will thus absorb into any polymer present. Absorption of analyte causes peak tailing which decreases the resolution of the chromatogram (which eliminates silicone O-rings for use in GC). Any polymer or dead space could be a place for analyte to pool, distorting the signal.

It was discovered that infiltration between the capillary and the microchannel creates a gas-tight interface between the 3D printed metallic body having the column or microchannel extending therethrough and metallic capillary tubing which is inserted into the printed part before thermal bonding and used for fluid connection to other instrumentation. The infiltrant may include any infiltrant described herein, such as a bronze powder, a copper powder, a zinc powder, tin and/or combinations or alloys thereof. To control infiltration in the interface between the capillary and the microchannel, sacrificial powder may be used. Using the infiltrant to fill in any gaps, the interface between the metallic capillary and the metallic body that includes the microchannel is nonporous (e.g., substantially no dead space is present), according to an embodiment. More specifically, after printing and thermal bonding of a part (e.g., metallic capillary and/or metallic body including a microchannel) but prior to infiltration, a reservoir of sacrificial powder may be placed in contact with the part. This sacrificial powder may include pore dimensions larger than the pores in the porous printed matrix and larger than the gap between the outer diameter of the capillary and the inner of the hole (e.g., inlet or outlet) into which the capillary is insert, but smaller than the microchannels. Therefore, after infiltrant fills the porous printed matrix and fuses the capillary to the part, excess infiltrant fills the sacrificial powder instead of the microchannels. In some embodiment, the infiltrated interfaces between capillaries and microchannels according the systems and methods described herein withstood pressures of at least 100 PSI and showed no leakage after thermal cycling to 350° C. Additionally, cross-sections of the interfaces showed smooth connections between the channel and the capillary with little to no dead volume.

The interfaces formed according to at least one, some, or all embodiments described herein are high-temperature, thermally-cyclable, and low-dead-volume. For example, microfluidic interfaces fabricating according to embodiments described herein may binder-jet printing and infiltration to create a mechanically robust, pure metal interface. An infiltrant pressure control may be used during fabrication to cause infiltrant to fill the voids in the porous printed matrix (e.g., the 3D-printed part) and fuse a stainless-steel capillary to a printed microchannel while at the same time preventing infiltrant from filling the channel or the capillary.

Figure 7:
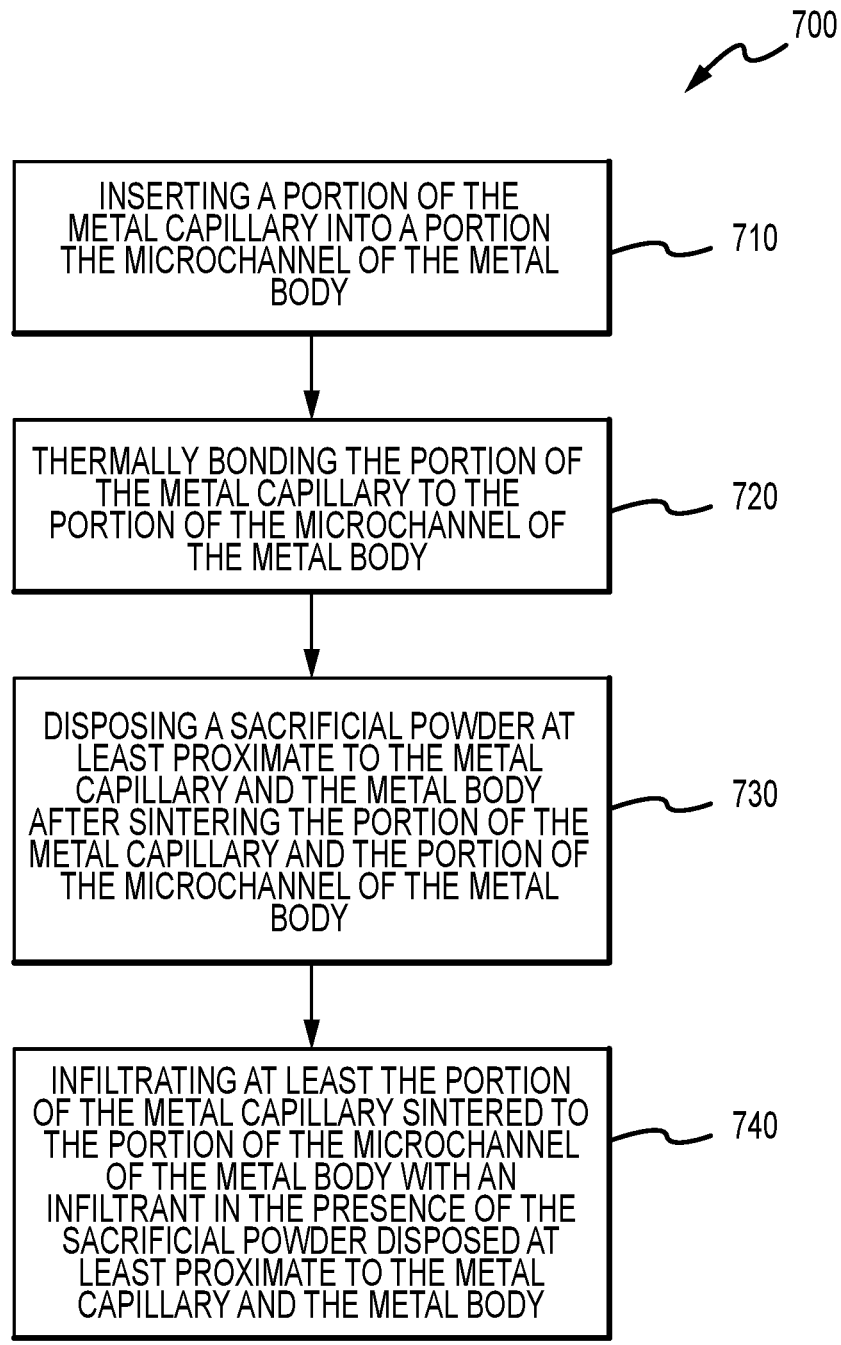
FIG. 7 is a flow diagram of a method for interfacing a metallic capillary in a microchannel of a metallic body.

FIG. 7 is a flowchart for a method 700 of interfacing a metallic capillary in a microchannel of a metallic body, according to an embodiment. The method 700 includes an act 710 of inserting a portion of the metallic capillary into a portion the microchannel of the metallic body. The method 700 includes an act 720 of thermal bonding the portion of the metallic capillary to the portion of the microchannel of the metallic body. Thermal bonding may include one or more of sintering, brazing, soldering, and/or combinations thereof. The method 700 includes an act 730 of disposing a sacrificial powder at least proximate to the metallic capillary and the metallic body after thermally bonding the portion of the metallic capillary and the portion of the microchannel of the metallic body. The method also includes an act 740 of infiltrating at least the portion of the metallic capillary thermally bonded to the portion of the microchannel of the metallic body with an infiltrant in the presence of the sacrificial powder disposed at least proximate to the metallic capillary and the metallic body. Acts of the method 700 are for illustrative purposes. For example, the acts of the method 700 may be performed in different orders, split into multiple acts, modified, supplemented, or combined.

The method 700 may include any aspects of 3D printing, metallic plates, metallic structures, thermal bonding, infiltration, and materials described herein, without limitation. For example, the method 700 may incorporate aspects and/or be performed simultaneously and in junction with the method 400. Accordingly, the method 700 may include an act of 3D printing multiple metallic plates including a recessed channel, stacking (e.g., interfacing) the metallic plates to form a microchannel therein, inserting a capillary into an inlet (and/or outlet) in fluid communication with the microchannel (as described in the act 710), simultaneously thermally bonding (e.g., sintering, brazing, and/or soldering) the metallic plates and the metallic capillary (e.g., tube) to one another (as described in the acts 440 and 720), and then simultaneously infiltrating the resulting metallic structure or body with an infiltrant in the presence of a sacrificial powder (as described in the acts 450 and 740).

In some embodiments, the method 700 further comprises an act of 3D printing the metallic body including the microchannel. More particularly, the method 700 may include 3D printing multiple plates at least some of which include an elongated channel, such as 3D printing metallic plates 505 as described in greater detail above. The multiple plates and/or metallic body may be 3D printed with a metallic material according to any of the 3D printing processes provided herein. In some embodiments, the multiple metallic plates and/or metallic body are binder jet 3D printed with a stainless steel material or any other material described above. In some embodiments, after printing and curing the metallic plate and/or metallic body, loose powder may be removed from elongated slot or elongated channel using brushes and/or compressed air. In some embodiments, the method 700 may further include an act of thermally bonding the metallic plates (as 3D printed) together to form a metallic body having a microchannel therein, as described above in relation to the act 440 of the method 400. The metallic plates may be thermally bonded together to form the metallic body before the acts 710 and/or 720 of the method 700, according to an embodiment.

The microchannel of the metallic body in the method 700 may include portions having different widths or diameters. For example, the microchannel may include a first portion (e.g., outer portion) having a first width and an interior portion having a second width that is less than the first width. The first portion of the microchannel having the greater width may be an inlet and/or outlet of the metallic body into which a capillary is inserted. Accordingly, the method 700 may include 3D printing the metallic body to include the portion of the microchannel having a first width and the microchannel including an interior portion having a second width less than the first width. In embodiments including the metallic plates of the method 400, the method 700 may include 3D printing at least one metallic plate (e.g., two metallic plates) to include a first portion of the elongated slot having a first width at an edge of the plate and a second, interior portion of the elongated slot having a second width less than the first width of the first portion of the slot to function as the inlet and/or outlet. In embodiments including the metallic plates of the method 400, the method 700 may include 3D printing at least one metallic plate (e.g., two metallic plates) to include an opening (e.g., inlet or outlet, such as opening 526) having first width that will be in fluid communication with the elongated slot/elongated channel having a second width less than the first width of adjacent plates when the plates are stacked. The act 710 may then include inserting the portion of the metallic capillary into the portion of the microchannel having the first width, the metallic capillary having a width greater than the second width of the interior region of the microchannel.

In some embodiments, the act 720 of thermally bonding the portion of the metallic capillary to the portion of the microchannel of the metallic body may include any aspect of thermal bonding (e.g., sintering) described elsewhere in this documents, such as any of the materials, conditions, temperatures, times, and atmospheres of thermal bonding described in relation to the act 440 of thermally bonding the metallic plates together to form a metallic body in the method 400. For example, the act 720 of thermally bonding the portion of the metallic capillary to the portion of the microchannel of the metallic body may include heating the metallic capillary and the metallic body to a predetermined temperature of at least 1000° C. for a predetermined time of at least 10 minutes in the presence of argon and hydrogen, cooling the metallic capillary and the metallic body after heating to the predetermined temperature for the predetermined time, and/or stopping a flow of the hydrogen and increasing a flow of the argon around the metallic capillary and the metallic body. In some embodiments, the metallic capillary may be thermally bonded to the metallic body after the metallic body is preformed and/or thermally bonded together. In some embodiments, the act 720 of thermally bonding the portion of the metallic capillary to the portion of the microchannel of the metallic body may include an act of high-temperature thermally bonding (e.g. sintering) the portion of the metallic capillary to the portion of the microchannel of the metallic body, and the acts 740, 750 of the method 700 may be absent from the method 700. In some embodiments, the act 720 of thermally bonding the portion of the metallic capillary to the portion of the microchannel of the metallic body may include an act of high-temperature thermally bonding (e.g. sintering) the portion of the metallic capillary to the portion of the microchannel of the metallic body at a predetermined temperature of at least about 1250° C., at least about 1300° C., at least about 1350° C., at least about 1400° C., at least about 1450° C., at least about 1500° C., about 1250° C. to about 1500° C., about 1250° C. to about 1350° C., or about 1350° C. to about 1450° C. In some embodiments, the method 400 may be combined with the method 700 such that the act 440 of thermally bonding the metallic plates together to form a metallic body may be performed at the same time as the act 720 of thermally bonding the portion of the metallic capillary to the portion of the microchannel. In some embodiments, the metallic body may be preformed, and the act 720 may be absent from the method 700.

The sacrificial powder used in the act 730 of disposing a sacrificial powder at least proximate to the metallic capillary and the metallic body may include any sacrificial powder described herein. For example, in some embodiments, the sacrificial powder used in the act 730 includes a stainless steel powder.

In some embodiments, the act 740 of infiltrating at least the portion of the metallic capillary thermally bonded to the portion of the microchannel of the metallic body with an infiltrant in the presence of the sacrificial powder disposed at least proximate to the metallic capillary and the metallic body may include any aspect of infiltrating described elsewhere in this documents, such as any of the materials, conditions, temperatures, times, and atmospheres of infiltrating described in relation to the act 450 of infiltrating the metallic body with an infiltrant 450. For example, the infiltrant may include a bronze powder, a copper powder, a zinc powder, tin or combinations thereof.

In some embodiments, the act 740 may include infiltrating the metallic body including the portion of the metallic capillary thermally bonded to the portion of the microchannel of the metallic body with the infiltrant in the presence of the sacrificial powder disposed at least proximate to the metallic capillary and the metallic body. In some embodiments, the act 740 may include infiltrating at least the portion of the metallic capillary thermally bonded to the portion of the microchannel of the metallic body with the infiltrant in the presence of the sacrificial powder for at a predetermined time and at a predetermined temperature of at least 1000° C. to melt and solidify the infiltrant. In some embodiments, the act 740 includes infiltrating at least the portion of the metallic capillary thermally bonded to the portion of the microchannel of the metallic body with the infiltrant in the presence of the sacrificial powder at a pressure of about −1 kPa or less.

In some embodiments, the method 400 may be combined with the method 700 such that the act 450 of infiltrating the metallic body with an infiltrant is performed at the same time as (e.g., simultaneous with) the act 740 of infiltrating at least the portion of the metallic capillary thermally bonded to the portion of the microchannel of the metallic body with an infiltrant in the presence of the sacrificial powder. In some embodiments, the metallic body may be infiltrated prior to the act 740 of infiltrating at least the portion of the metallic capillary thermally bonded to the portion of the microchannel of the metallic body with an infiltrant in the presence of the sacrificial powder After the act 740 is performed, at least the portion of the metallic capillary thermally bonded to the portion of the microchannel of the metallic body with the infiltrant in the presence of the sacrificial powder forms a structure including the metallic capillary interfacing microchannel (e.g., the inlet/outlet, or the first, wider portion of the microchannel) such that the metallic structure is substantially devoid of gaps or spaces between the inlet/outlet of the microchannel and the portion of the capillary. Accordingly, the method 700 results in microfluidic device having a capillary interfaced with a microchannel without dead space being present in the interfacing of the capillary and the microchannel.

In some embodiments, the act 740 may include microchannel and capillary surface poisoning with where there is no pressure control (e.g., sacrificial powder is not used or is absent). Instead, in some embodiments, the microchannel and the inside of the capillary are "poisoned" prior to infiltration. Poisoning may include coating the sidewalls of the microchannel and/or capillary with a material that the infiltrant does not wet. The infiltrant may fill the space between the capillary and the metallic part defining the microchannel, but would not fill the channel or capillary due to the "infiltrant-phobic" coating. More infiltrant than needed may be used to ensure there is enough infiltrant to fill the space between the capillary and the metallic part defining the microchannel, and excess infiltrant pools outside the part the interface (and remains absent from the microchannel).

In some embodiments, a capillary is interfaced with a 3D printed part (e.g., as described above) and the 3D printed part is interfaced with the metallic channel. These steps could be done together (e.g., simultaneously) or separately. In some embodiments, the part containing the metallic microchannel may be machined such that the end of the microchannel sticks out of the metallic structure in a way resembling a capillary (though diameter or shape may be different the capillary). A 3D printed part may then be placed between a standard metal capillary and the machined "capillary" sticking out of the metallic structure. The metal capillary and the machined capillary may then be sintered and/or infiltrated to seal everything together.

In some embodiments, the method 700 may include spot welding the junction between the end of the capillary and the microchannel after the capillary is in contact with the microchannel. In this approach, care should be taken to include a small enough amount of molten metal at the weld so that the molten metal does not wick into the microchannel and/or capillary. Two potential methods of spot welding may include a friction weld or an arc weld. In the friction weld the capillary may be rotated or vibrated to weld the junction. In the arc weld, the metal capillary may be electrically isolated from the metal channel except for at the junction and flow a larger current through the junction.

In some embodiments, non-metallic capillaries and structures defining the microchannel may be used. For example, a fused silica capillary may be interfaced with a glass or polymer structure defining the microchannel using a polymer infiltrant.

Figure 8A:
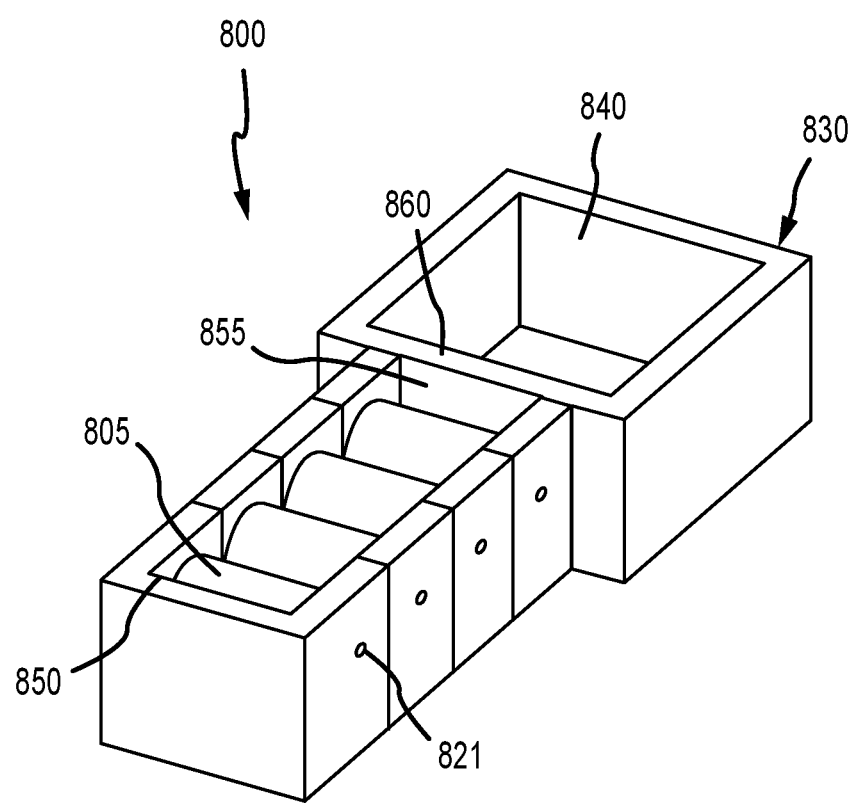

FIG. 8A-8F show various views and stages of a system 800 for interfacing a metallic capillary with a metallic microchannel to form a microfluidic device, according to an embodiment. FIG. 8A is an isometric view and FIG. 8B is a transparent top view of a support 830 for interfacing a metallic capillary (not shown) with a metallic body 805 having an inlet 821, an outlet 822 (shown in FIG. 8B), and a microchannel 820 extending between the inlet 821 and the outlet 822, according to an embodiment. Although shown with a preformed metallic body 805 having a microchannel 820 therein, systems may include a support with a region configured to hold multiple metallic plates (e.g., 3D printed plates), at least some of which include an elongated channel, as described above in relation to FIG. 5B. For example, one or more of the metallic plates 505a-d may include the inlet 821 and the outlet 822. Moreover, although the microchannel 820 is generally linear in the embodiment shown in FIG. 8B, the microchannel may include any of the features of the microchannels described through this documents, such as a microchannel that extends within the metallic body in three dimensions or three theoretical planes. For example, the microchannel 820 may extend within the metallic body at least partially along a first theoretical plane, at least partially along a second theoretical plane angled relative to the first theoretical plane, and at least partially along a third theoretical plane angled relative to the first theoretical plane and the second theoretical plane.

The support 830 is configured such that the metallic body 805 may be individually removed from the support 830 after thermal bonding and infiltration. In some embodiments, the support 830 includes a region 550 that holds the metallic body 805 (or metallic bodies 805) and the sacrificial powder. When the metallic body 805 is positioned in the region 850, a cavity 855 or compartment may be formed above the metallic body 805, and the sacrificial powder may be disposed in this cavity 855. A divider 860 may separate the cavity 855 from a basin 840 for holding the infiltrant.

Turning to FIG. 8C, which shows a cross-sectional view of a portion of the metallic body 805, according to an embodiment. The microchannel 820 may have a width of less than about 1000 µm. For example, the microchannel may have any of the widths or diameters of the slots 420 or microchannels 620 provided above. The inlet 821 and the outlet 822 may include inner widths or diameters greater than the inner width or diameter of the microchannel 820. For example, the inner width or diameter of the inlet 821 and/or the outlet 822 may be greater than the inner width or diameter of the microchannel 820 by about 100 µm to about 500 µm, about 100 µm to about 300 µm, about 300 µm to about 500 µm, about 100 µm to about 200 µm, about 200 µm to about 300 µm, about 300 µm to about 400 µm, about 400 µm to about 500 µm, about 200 µm to about 250 µm, about 250 µm to about 300 µm, about 300 µm to about 350 µm, about 350 µm to about 400 µm, about 400 µm to about 450 µm, about 500 µm or less, about 400 µm or less, about 300 µm or less, about 200 µm or less, or about 100 µm or less.

As described in the method 700, a capillary may be inserted into a portion of the microchannel before thermally bonding the microchannel to the metallic body and/or infiltration. For example, an inlet metallic capillary 811 may be inserted into the inlet (shown in the cross-sectional view of a portion of the metallic body of FIG. 8F) and/or an outlet metallic capillary 812 may be inserted into the outlet 822 (shown in the cross-sectional view of a portion of the metallic body FIG. 8D). The inlet metallic capillary 811 and/or the outlet metallic capillary 812 includes an outer diameter less than the inner diameter of the inlet 821 and/or the outlet 822, respectively. For example, the inner width or diameter of the inlet 821 and/or the outlet 822 may be greater than the outer width or diameter of the inlet metallic capillary 811 and/or the outlet metallic capillary 822, respectively, by about 1 µm to about 20 µm, about 1 µm to about 10 µm, about 10 µm to about 20 µm, about 1 µm to about 5 µm, about 7.5 µm to about 12.5 µm, about 10 µm to about 15 µm, about 15 µm to about 20 µm, about 5 µm to about 7 µm, about 7 µm to about 9 µm, about 9 µm to about 11 µm, about 11 µm to about 13 µm, about 13 µm to about 15 µm, about 5 µm, about 6 µm, about 7 µm, about 8 µm, about 9 µm, about 10 µm, about 11 µm, about 12 µm, about 13 µm, about 14 µm, about 15 µm, about 15 µm or less, about 13 µm or less, about 11 µm or less, about 9 µm or less, or about 7 µm or less. In some embodiments, the outer width or diameter of the inlet metallic capillary 811 and/or the outlet metallic capillary 812 is about 1100 µm or less, less than about 1000 µm, less than about 900 µm, less than about 800 µm, less than about 700 µm, less than about 600 µm, less than about 500 µm, less than about 450 µm, less than about 400 µm, less than about 350 µm, less than about 300 µm, less than about 250 µm, about 250 µm to about 1000 µm, about 250 µm to about 750 µm, about 500 µm to about 1000 µm, about 250 µm to about 500 µm, about 500 µm to about 750 µm, about 750 µm to about 1000 µm, about 300 µm to about 400 µm, about 400 µm to about 500 µm, about 500 µm to about 600 µm, about 600 µm to about 700 µm, about 700 µm to about 800 µm, about 800 µm to about 900 µm, or about 900 µm to about 1000 µm.

Figures 8F, 8G:
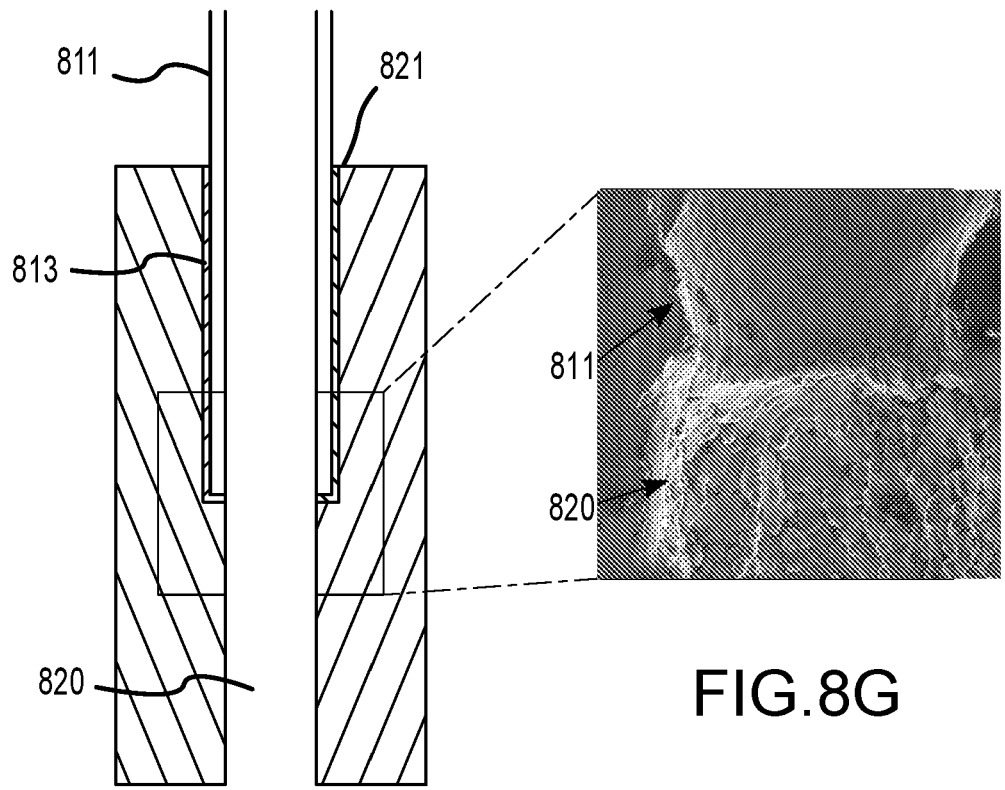

As described above in the method 700, the inlet metallic capillary 821 and/or outlet metallic capillary 822 may be thermally bonded (e.g., sintered, brazed, and/or soldered) to the metallic body, then infiltrated with an infiltrant in the presence of a sacrificial powder. The infiltrant may include any infiltrant described herein, such as bronze, copper, a zinc, tin and/or combinations or alloys thereof. The sacrificial powder may include any sacrificial powder described herein, such as stainless steel powder. FIG. 8E is a cross-sectional views of the outlet capillary 812 thermally bonded to the outlet 822 and infiltrated with an infiltrant in the presence of a sacrificial powder. After thermal bonding and infiltration, an outlet interface 814 is formed between the outlet capillary 812 and the outlet 822 of the metallic body 805. The outlet interface 814 is substantially devoid of an adhesive and devoid of openings, gaps, or spaces (e.g., dead space) between the portion of the outlet metallic capillary 812 and the metallic body 805 at the outlet 812. FIG. 8F is a cross-sectional views of the inlet capillary 811 thermally bonded to the inlet 821 and infiltrated with an infiltrant in the presence of a sacrificial powder. After thermal bonding and infiltration, an inlet interface 813 is formed between the inlet capillary 811 and the inlet 821 of the metallic body 805. The inlet interface 813 is substantially devoid of an adhesive and devoid of openings, gaps, or spaces (e.g., dead space) between the portion of the inlet metallic capillary 811 and the metallic body 805 at the inlet 811. Infiltration fills pores in the printed matrix (e.g., the 3D printed metallic body) and the space between capillaries 811, 812 and the printed part of the metallic body 805, as well as partially fills the sacrificial powder, while leaving the microchannel 820 and capillaries 811, 812 empty (e.g., devoid of the infiltrant and sacrificial powder).

FIG. 8G is a scanning electron microscope image of an interface between a capillary and an inlet or outlet of a metallic body taken after the interface of an embodiment was cross sectioned using an end mill. The interface shows a relatively smooth connection between the capillary 811 and the printed microchannel 820 with no apparent gaps between the capillary 811 and the microchannel 820. Dead volumes in the interface is substantially absent from the interface.

As provided above, in some embodiments, the capillaries 811, 812 may be thermally bonded and infiltrated simultaneously with thermally bonding and infiltration of 3D printed metallic plates that form the metallic body or structure after thermal bonding. Accordingly, the microfluidic device formed according to the method 700 and the system 800 may include, similar to the microfluidic device 500, a first internal region defining at least a portion of the microchannel and including the inlet interface and the outlet interface. The first internal region may be substantially devoid of pores or spaces in the first internal region. The microfluidic device formed according to the method 700 and the system 800 also may include, similar to the microfluidic device 500, a second internal region spaced from the first internal region and including one or more pores or spaces in the second internal region.

Figure 9A:
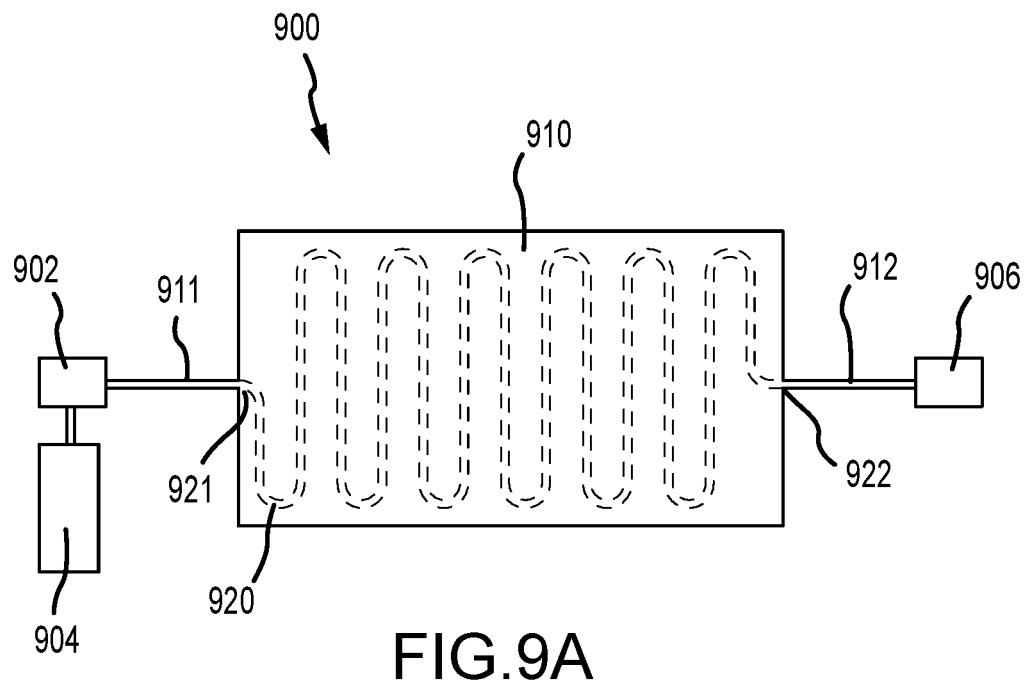
FIG. 9A is a block diagram of a gas chromatography system, according to an embodiment.

In some embodiments, microfluidic devices formed according to the method 700 and/or the system 800 including at least one (e.g., both) may be used in a microfluidic system. For example, turning to FIG. 9A, a microfluidic system including a micro-GC system 900 may include a microfluidic device 910 (e.g., metallic structure) formed according to the systems and methods described herein. More specifically, the microfluidic device 910 may include an inlet 921, and outlet 922, a microchannel 920 extending within the microfluidic device 910 between the inlet 921 and the outlet 912, an inlet capillary 911 thermally bonded and infiltrated at the inlet 921, and an outlet capillary 912 thermally bonded and infiltrated at the outlet 922. The microfluidic device 910 may function as the columns of the micro-GC system 900 and may be formed according to any aspect of the methods 400 and 700, e.g., the microfluidic device may be formed by 3D printing multiple metallic plates including a recessed channel, stacking the metallic plates to form a microchannel therein, inserting the inlet capillary 911 into the inlet 921 in fluid communication with the channel, inserting the outlet capillary 912 into the outlet 922, thermally bonding the metallic plates and the metallic capillary to one another, and then infiltrating the resulting metallic structure or body with an infiltrant in the presence of a sacrificial powder. The inlet metallic capillary 911 may interface the microfluidic structure 910 at an inlet interface at least proximate to the inlet 921 of the microfluidic device 910. The inlet interface between a portion of the inlet metallic capillary 911 and the microfluidic device 910 at the inlet is devoid of an adhesive and devoid of gaps or spaces between the portion of the inlet metallic capillary 911 and the microfluidic device 910 at the inlet 921. The outlet metallic capillary 912 interfaces the microfluidic device 910 at an outlet interface at least proximate to the outlet 922 of the microfluidic device 910. The outlet interface between a portion of the outlet metallic capillary 912 and the microfluidic device 910 at the outlet 922 is devoid of an adhesive and devoid of gaps or spaces between the portion of the outlet metallic capillary 912 and the microfluidic device 910 at the outlet 922.

The micro-GC system 900 also may include other aspects of a micro-GC system, such as an injector or pre-concentrator 902 in fluid communication with the inlet capillary 911 and configured to receive a sample gas, a source 904 of carrier gas in fluid communication with the injector or pre-concentrator 902 with the injector or pre-concentrator 902 fluidly between the source 904 of carrier gas and the inlet capillary 911, and a detector 906 in fluid communication with the outlet capillary 912 with the outlet capillary 912 between the microfluidic device 910 and the detector 906.

Figure 9B:
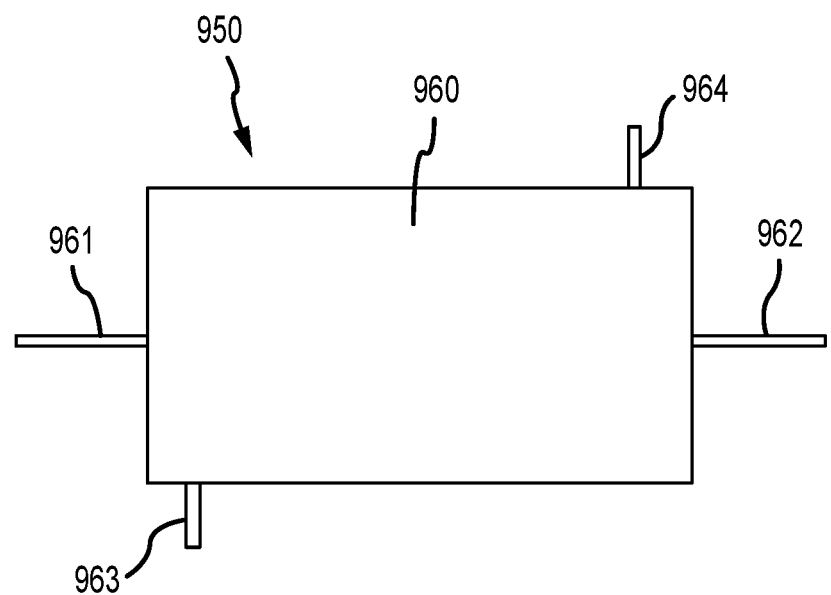
FIG. 9B is a block diagram of a heat exchanger system, according to an embodiment.

Turning to FIG. 9B, a microfluidic system including a micro heat exchanger system 950 may include a microfluidic device 960 formed according to the systems and methods described herein. More specifically, the microfluidic device 960 may include an inlet, and outlet, a microchannel extending within the microfluidic device 960 between the inlet and the outlet, an inlet capillary 961 thermally bonded and infiltrated at the inlet, and an outlet capillary 962 thermally bonded and infiltrated at the outlet. In the micro heat exchanger system 950, the inlet capillary 961 may receive hot water. The microchannel may include any aspect of the microchannels described herein. The inlet metallic capillary 961 may interface the microfluidic structure 960 at an inlet interface at least proximate to the inlet of the microfluidic device 960. The inlet interface between a portion of the inlet metallic capillary 961 and the microfluidic device 960 at the inlet is devoid of an adhesive and devoid of gaps or spaces between the portion of the inlet metallic capillary 961 and the microfluidic device 961 at the inlet. The outlet metallic capillary 962 interfaces the microfluidic device 960 at an outlet interface at least proximate to the outlet of the microfluidic device 960. The outlet interface between a portion of the outlet metallic capillary 962 and the microfluidic device 960 at the outlet is devoid of an adhesive and devoid of gaps or spaces between the portion of the outlet metallic capillary 962 and the microfluidic device 962 at the outlet.

The microfluidic device 960 of the micro heat exchanger system 950 also may include an additional inlet, an additional outlet, and an additional microchannel extending therein between the additional inlet and the additional outlet. The additional microchannel may include any aspect of the microchannels described herein. The microfluidic device 950 also may include an additional inlet metallic capillary interfacing the microfluidic device 950 at an additional inlet interface at least proximate to the additional inlet of the metallic structure. In the micro heat exchanger system 950, the inlet capillary 961 may receive hot water. The microfluidic device 960 also may include an additional outlet metallic capillary interfacing the microfluidic device 960 at an additional outlet interface at least proximate to the additional outlet of the microfluidic device 960. The additional inlet metallic capillary 963 may interface the microfluidic structure 960 at an inlet interface at least proximate to the additional inlet of the microfluidic device 960. The inlet interface between a portion of the additional inlet metallic capillary 963 and the microfluidic device 960 at the additional inlet is devoid of an adhesive and devoid of gaps or spaces between the portion of the additional inlet metallic capillary 963 and the microfluidic device 960 at the additional inlet. The additional outlet metallic capillary 964 interfaces the microfluidic device 960 at an outlet interface at least proximate to the additional outlet of the microfluidic device 960. The outlet interface between a portion of the additional outlet metallic capillary 964 and the microfluidic device 960 at the additional outlet is devoid of an adhesive and devoid of gaps or spaces between the portion of the additional outlet metallic capillary 964 and the microfluidic device 960 at the additional outlet.

The microfluidic device 960 may be formed according to any aspect of the methods 400 and 700, e.g., the microfluidic device may be formed by 3D printing multiple metallic plates including a recessed channel, stacking the metallic plates to form a microchannel therein, inserting the inlet capillary 961 into the inlet in fluid communication with the microchannel, inserting the outlet capillary 962 into the outlet in fluid communication with the microchannel, inserting the additional inlet capillary 963 into the additional inlet in fluid communication with the additional microchannel, inserting the additional outlet capillary 964 into the additional outlet in fluid communication with the additional microchannel, thermally bonding the metallic plates and the metallic capillaries to one another, and then infiltrating the resulting metallic structure or body with an infiltrant in the presence of a sacrificial powder.

In operation of the micro heat exchanger system 950, hot water may be injected in the microfluidic device 960 through the inlet capillary 961, then exit the microfluidic device 960 at a cooler temperature. Cold water may be injected into the microfluidic device 960 through the additional inlet capillary 963, then exit the microfluidic device 960 at a warmer temperature. The microchannel and the additional microchannel may be at least proximate to one another within the microfluidic device 960 effective to allow a heat exchange between the fluids in the microchannel and the additional microchannel.

Example 1

In an example, plates including an elongated slot were 3D printed using stainless steel powder SS316L D90<22 μm from ExOne Co. and an ExOne Innovent+ binder jet printer. Each plate had a flat underside that acted as a top to the imprinted elongated slot in the plate below it. Excess printed powder was easily cleared from the plates using an air hose. Plates were stacked in an alternating pattern to form one continuous 610 μm diameter microchannel.

The base included an infiltrant holder and walls around the channeled portion (e.g., stacked plates) to hold the sacrificial powder. The sacrificial powder was SS316L 100 mesh (150 μm) from Alfa Aesar. The infiltrant was c90700 bronze powder (90% copper, 10% tin). A lid block raised the top of the stacked structure above the walls of the base, similar to the assembly shown in FIG. 4B. The stackable block structure was assembled, and a 180 g weight was placed on top.

The assembly was sintered at 800° C. for an hour and at 1135° C. for twenty minutes in an atmosphere of hydrogen and argon. During sintering, the weight visually reduced warping and improved the sealing between plates. Once sintered, bronze powder was poured into the infiltrant holder and sacrificial powder was poured around the stacked plates. The structure was infiltrated at 1135° C. for two hours in an atmosphere of hydrogen and argon.

The samples were milled to see the internal structure of the channels and inspect the sealing between plates and infiltrant overflow in the microchannels and the sacrificial powder. The infiltration further sealed the separate plates together, creating one long connected microchannel in the metallic structure. All portions of the microchannel remained clear of infiltrant. Most of the sacrificial powder filled, but large and small voids were present in the solidified sacrificial powder (see, for example, FIG. 6B).

This example indicated that it is possible to make long microchannels with small diameters out of stainless steel via binder jet 3D printing. An open-faced, segmented design allows powder to be cleared without sacrificing channel length. Sintering and infiltration seal the separate plates together. Infiltration can be controlled using sacrificial powder. This fabrication method could be used to create other complex geometries or to improve properties in 3D printed parts.

Example 2—Pore Filling

In order to determine parameters for sacrificial powder infiltration embodiments, a study was performed on bronze infiltration of sub-millimeter pores in binder jet printed stainless steel samples. Pore filling was characterized in microchannel segments with diameters of 370 µm, 650 µm, and 930 µm.

Printing: An ExOne Innovent+ binder jet printer was used to print stainless steel samples. The powder used was gas atomized spherical SS316L powder with D90<22 µm (Ex-One Co.). ExOne aqueous binder (part #: 7100037CL) was used during printing and binder was cured by placing samples in an oven at 180° C. for at least 6 hours. After curing, samples were removed from the print bed and loose powder was removed from semi-enclosed features using brushes and compressed air at 25-55 PSI.

Sintering: Samples were sintered in a 2.7-inch diameter tube furnace that included a heating zone and a cooling zone (see supplementary material for a diagram of the furnace setup). For sintering, samples were placed into a stainless steel sample holder and pushed into the heating zone. Argon and hydrogen were then flowed through the tube at 700 SCCM and 200 SCCM, respectively, while the temperature was ramped from room temperature to about 800° C. (ramp rate about 13° C./min), held for 1 hour for binder burnout, ramped to the desired sintering temperature (ramp rate about 6° C./min), and held for 20 min. Samples were cooled rapidly as follows. For the last 5 min of the sintering time, hydrogen flow was stopped, and argon flow was increased to 1400 SCCM to flush the hydrogen from the tube. After this, the sample was rapidly moved to the cooling zone (−200° C.), left there for 20 minutes still under the argon flow, and then removed from the furnace.

Infiltration: After sintering, samples for the pore filling study were infiltrated with bronze using −325 mesh 10% Sn bronze powder (OzoMetal LLC) as follows. The needed amount of bronze infiltrant depended on the post-sintering void fraction of the porous printed matrix and was calculated according to the equation:

$$M_{bronze} = \left( \frac{M * V_{design} * \varepsilon_V}{M_{avg}} - \frac{M}{\rho_{SS}} + V_{channels} * \varepsilon_V \right) * \beta * f * \rho_{bronze}$$

The terms in the equation are as follows: M is the post-sintering measured mass of the individual sample, $M_{avg}$ is the average post-sintering mass of samples, $\varepsilon_V$ is the fractional volumetric shrinkage due to sintering (calculated by measuring part dimensions before and after sintering), $\rho_{SS}$ is the density of bulk SS316L, $V_{channels}$ is the total designed volume of the channels, $\beta$ is the volumetric thermal expansion of stainless steel at 1000° C. which affects the void volume of the part (about 1.05), f is the desired fractional fill of the total void volume, and $\rho_{bronze}$ is the estimated density of liquid bronze at 1000° C. (about 7.85 g/cm$^3$). The bronze was placed into an infiltrant holder printed as an integral part of the sample. Samples were placed into a quartz lined stainless steel sample holder and put into the furnace by initially setting the sample inside the cooling zone, closing the end cap, and flowing argon at 1400 SCCM for 5 minutes to flush air from the tube. The sample was then moved to the heating zone (about 800° C.), argon and hydrogen flow were set to 700 SCCM and 200 SCCM, respectively, and the furnace was ramped to the infiltration temperature where it was held for the desired infiltration time (ramp rate about 6° C./minute). Samples were then cooled according to the same rapid cooling procedure used after sintering. After removal from the furnace, the sample was optically imaged (while backlit with a white LCD screen) to determine which holes were empty and fill height was measured as the distance from the base of the sample to the highest filled hole in each column.

Results: To determine the dependence of pore filling on pore size, samples with three different pore sizes were prepared and results were compared to capillary model predictions. Each sample was designed with through holes (horizontal microchannel segments) allowing easy observation of pore filling. These through-hole samples were printed, sintered, and infiltrated. Various infiltration conditions (shown in Table 1) were used to explore the effect of infiltration time and temperature on pore filling. Enough bronze powder was added to the bronze holder to allow filling of the porous printed matrix and roughly half of the through holes to allow comparison of the fill height in different hole sizes.

TABLE 1

Infiltration Times and Temperatures

| | Sintering | Infiltration |
| --- | --- | --- |
| Condition 1 | 20 min at 1085 C. | 3.5 hrs at 1085 C. |
| Condition 2 | 20 min at 1085 C. | 5 hrs at 1085 C. |
| Condition 3 | 20 min at 1135 C. | 3 hrs at 1135 C. |
| Condition 4 | 20 min at 1135 C. | 5 hrs at 1135 C. |

Filled holes were readily observed due to the blocked light transmission. The term fill height is used to denote the highest filled hole in each vertical column of holes. There are several observations from these results:
1. The fill height of smaller holes was generally greater than that of larger holes.

2. In same-sized holes, there was significant variation in fill height across the sample. This lateral variation is well visualized in the medium holes where fill height can go up and down gradually across the sample.
3. There are abrupt fill height changes between adjacent vertical columns of different sized holes. These abrupt changes are very different than the gradual changes in same sized holes mentioned above.
4. In almost all columns, holes are filled from the bottom up with no empty holes below the highest filled holes. Across the 12 samples, the small hole columns almost always completely filled to the top of the sample (completely filled in 99 of 108 columns).

Observations 1, 3, and 4 are qualitative and in good agreement with capillary model predictions. The variation described in observation 2 represents a significant deviation from the model.

To analyze the variation in fill height of same-sized holes, histograms of fill heights of medium and large round hole columns were prepared. Because each sample had a slightly different infiltrant fill level, to allow for comparison between samples, fill height data in each sample were adjusted using the following equation:

$$h_{adj} = h - (\bar{h}_{sample} - \bar{h}_{all})$$

where $h_{adj}$ is the adjusted fill height data point, h is the unadjusted fill height data point, $\bar{h}_{sample}$ is the mean fill height of medium holes in the sample, and $\bar{h}_{all}$ is the mean fill height of medium holes across all samples. This made the mean fill height of data points in each sample the same as all other samples.

Medium hole columns showed fill-height distributions which have standard deviations and standard errors of 2.4 mm and 0.17 mm respectively. Large hole columns showed fill-height distributions which have standard deviations and standard errors of 4.5 mm and 0.70 mm respectively. Empty small hole data was too sparse in these samples for statistical analysis. There was no clear dependence of pore filling on infiltration time or temperature, therefore all four infiltration conditions were lumped together for this statistical analysis. In 5 of the 12 samples, either the medium holes were completely filled or the large holes were completely empty; these cases did not allow for analysis of variation in fill heights and therefore were not included in the statistical analysis.

Based on the fill-height data, two additional quantitative findings of note are as follows: 1) the average difference in fill height between medium and large hole columns is 8.3 mm and 2) the difference between the predicted fill volume (based on calculated void volume and infiltrant mass) and the measured fill level was found to be ±10%.

Example 3—Sacrificial Powder Infiltration Proof-of-Concept

After the pore filling study of Example 2, the parameters obtained from Example 2 were used to design and implement a proof-of-concept for the sacrificial powder infiltration process by fabricating 700 μm- and 930 μm-diameter microchannels, each 37 mm long.

Printing in Example 3 followed the same parameters as Example 2. In Example, sonication was also used for powder removal during which a small wire was inserted into the channels to loosen and remove unbound powder.

Applying the Capillary Model of Infiltration in Example 3: Adjustments to the capillary model of infiltration made for Example 3 after Example 2 included: 1) a standard deviation in infiltrant pressure of 180 Pa was included to account for the variation in effective pressure, 2) capillary pressures for all pore sizes were scaled down by a factor of 3 to account for surface tension uncertainty or other factors that could affect capillary pressure, and 3) an uncertainty in total void volume of ±10% was included. For high yield fabrication using Example 3, the microchannels, the sacrificial powder, and the porous printed matrix must have capillary pressures that are different enough to account for these model adjustments.

Infiltration: Samples were infiltrated using the same process as Example 2 with a few differences. Prior to infiltration, sacrificial powder was poured into the sacrificial powder cavities (see, for example, FIG. 2C). Sacrificial powder was water atomized −100 mesh (particle diameter <150 μm) SS316L powder (Thermo Fisher Scientific, product #: 11089). Sacrificial powder mass and volume were measured to calculate a void fraction of about 58%. Samples were placed into an alumina crucible and bronze powder was placed in the crucible around the sample. Following infiltration, channel filling was checked using backlighting and samples were milled for optical imaging.

Results: Based on the adjustments described above, an experiment was performed to test sacrificial powder and bronze infiltrant fabrication of microchannels. Three samples were designed as shown in FIG. 3A, printed, sintered (20 min at 1135° C.), and infiltrated (3 hours at 1135° C.). Samples were infiltrated with enough bronze to both fill the porous printed matrix and partially fill the sacrificial powder reservoirs. Capillary pressures for the porous printed matrix, the sacrificial powder, and the channel were calculated using equations above and are shown in Table 2. To ensure high-yield fabrication, the particle diameter of the sacrificial powder was chosen so that the differences in calculated capillary pressures between the three pore types in Table 2 were much larger than the variation in effective infiltrant pressure, even accounting for the scaling down of capillary pressures. The void volume of the sacrificial powder reservoirs was chosen to be approximately 40% of the total void volume to manage void volume uncertainty. Additionally, sacrificial powder was placed in close proximity with the channels to reduce the impact of infiltrant pressure variation across the part.

TABLE 2

Theoretical Capillary Pressures

| | $D_{sv}$ | Equivalent Pore Diameter | $P_c$ (Unscaled) | $P_c$ (Scaled down by 3) |
|---|---|---|---|---|
| Porous Printed Matrix | 8.7 μm | ~3 μm | −1200 kPa (Eq. 3) | −400 kPa |
| Sacrificial Powder | 70 μm | ~60 μm | −62 kPa (Eq. 3) | −20 kPa |
| 700 μm Channel | N/A | 700 μm | −5.7 kPa (Eq. 2) | −1.9 kPa |

Calculations for Table 2 were performed as follows. The capillary pressure Pc of the channel was calculated with a channel diameter of 700 μm. Pc for the sacrificial powder and the porous printed matrix was calculated with porosities ε of 0.58 and 0.36, respectively, and mean surface volume particle diameters $D_{sv}$ of 70 μm and 8.3 μm, respectively, where $D_{sv}$ was determined by assuming spherical powder with normal distributions (having standard deviation ⅓ the average diameter) around averages of 80 μm and 10 μm for the sacrificial powder and the porous printed matrix, respectively. Equivalent pore diameters for the powders were calculated from their values of $P_c$.

Post infiltration analysis showed that in each sample: 1) the porous printed matrix was filled, 2) the sacrificial powder reservoir was partially filled, and 3) none of the 700 or 930 μm channels were filled. The optical image in FIG. 3 is from a region of a milled, infiltrated sample and shows the well filled printed matrix 270, the partially filled sacrificial powder reservoirs 280 and pores 290, and an unfilled 700 μm channel 220.

In Example 3, twenty microchannels were successfully fabricated in each of three samples. These results show that sacrificial powder and bronze infiltration can be used for high-yield fabrication of metallic microchannels, as predicted by the large differences between capillary pressures for each of the different pore types. Additionally, fabrication was very likely successful because the sacrificial powder pores accounted for a large fraction of the total void volume and because the sacrificial powder was in close proximity to the channels. This work shows that with a few adjustments, the capillary model of infiltration is a useful tool for microfluidic fabrication design.

It may be concluded that when using SPI for fabrication of parts with internal structures of different sizes than the channels fabricated here, the size of the sacrificial powder may be adjusted to ensure a large gap in capillary pressure is maintained between the different pore types. Additionally, if desired, sacrificial powder may be cut off the part after infiltration.

Examples 2 and 3 advance additive manufacturing of metallic microfluidic devices by contributing sacrificial powder infiltration, a new method for infiltrant pressure control, and using this method to form sealed metallic microchannels. Sacrificial powder infiltration (including bronze) was used to seal the porous printed matrix of binder-jet printed parts while keeping printed microchannels free of infiltrant. Pore filling in capillary segments with various diameters was analyzed and it was found that while pore filling generally followed predictions from a capillary model of infiltration, there were significant deviations from the predicted behavior. Channels of a certain size did not always fill to the same height and the difference in fill height between channels of different sizes was much smaller than predicted. Based on these observations, adjustments were made when using the capillary model of infiltration to guide microfluidic device design. Sacrificial powder infiltration (including bronze) to fabricate 700 μm and 930 μm metallic microchannels. Cross-sections of the parts show fully dense printed matrix, semi-porous sacrificial powder, and empty microchannels. The large difference in capillary pressure for these three structures enabled high-yield fabrication.

Example 4

A design which incorporated sacrificial powder during infiltration was tested. This design had a cylindrical joiner that was surrounded by sacrificial powder (similar to FIG. 8). A separate chamber for bronze powder was included. This design featured printed hole sizes to accept McMaster and Agilent tubes. Two sizes of stainless steel capillary tubing were used. McMaster-Carr Extreme-Pressure Miniature Stainless Steel Tubing with an inner diameter of 0.508 mm was used. The other capillary size was Agilent's UltiMetal Plus Stainless-Steel Capillary Tubing having an inner diameter of 0.53 mm with an outer diameter of 0.8 mm.

The furnace process used for sintering and infiltration was the same as used in Example 3. The part was placed into the furnace on a boat. The boat was moved into the center of the furnace at room temperature. Hydrogen gas was flowed at 200 SCCM and argon gas was flowed at 1800 SCCM to create a reducing environment. The argon flow was reduced to 500 SCCM after ten minutes. Fans blew on either end of the quartz tube to reduce and control temperature while the furnace was heated to 1135° C. and allowed to rest at that temperature for twenty minutes. The hydrogen flow was cut off for the last five minutes and the argon flow was again set to 1800 SCCM to remove hydrogen from the furnace. Upon completion, the sample was then moved by the transfer arm to the edge of the furnace where the sample cooled for ten minutes. All gasses were turned off and the sample was removed from the furnace.

The sacrificial powder void volume was 339 mm$^3$ in volume, calculated as 58% of the total powder volume. Nine tests were performed with sacrificial powder for bronze control. 10% weight tin bronze was identified as a good candidate for infiltrating stainless-steel parts because of its low melting temperature (850° C.) and high thermal conductivity. Sintering temperature reached a maximum of 1165° C., which is well above the melting point of bronze, making it an appropriate temperature for infiltration as well. All of the tests were observed to have clear capillaries after infiltration (the excess powder created from insertion of McMaster capillaries had been removed following tube insertion using lab air). Four of the tests used McMaster capillary tubes. All of these McMaster capillary tests remained unblocked and did not show bubbles when the exit was blocked. Five of the tests were with Agilent capillary tubing. Upon visual inspection all of the Agilent test samples remained clear of bronze.

Example 5

Printing: An ExOne Innovent+BJ printer was used to print stainless steel samples similar to the structure shown in FIG. 8A. The powder used was spherical SS316L powder with D90<22 μm (ExOne Co.). ExOne aqueous binder (part #: 7100037CL) was used during printing and binder was cured by placing samples in an oven at 180° C. for 6 or more hours. After curing, samples were removed from the print bed and loose powder was removed from semi-enclosed features using brushes and compressed air at 25-55 PSI. The samples included channels each having a wide portion and a narrow portion. The wide portion of the channels included inner diameters of 810 μm, 840 μm, 870 μm, and 900 μm. The narrow portion of the channels included an inner diameter of 570 μm ID. Short segments of SS316 capillary were inserted into the wide portion of the channels to form an initial interface between the capillaries and the channels, similar to that shown in FIGS. 8C-8D.

Sintering: Samples were sintered in a 2.7-inch diameter tube furnace that included a heating zone and a cooling zone. For sintering, samples were placed into a stainless steel sample holder and pushed into the heating zone. Argon and hydrogen were then flowed through the tube at 500 SCCM and 200 SCCM, respectively, while the temperature was ramped from room temperature to 1135° C. (ramp rate started at 13° C./min and slowed to 6° C./min as temperature increased) and held for 20 min. Samples were cooled rapidly as follows. For the last 5 minutes of the sintering time, hydrogen flow was stopped and argon flow was increased to about 1800 SCCM to flush the hydrogen from the tube. After this, the sample was rapidly moved to the cooling zone (about 200° C.), left there for 20 minutes under the argon flow, and then removed from the furnace.

Infiltration: After sintering, samples were infiltrated with bronze in the same furnace as used for sintering. The bronze used was −325 mesh 10% Sn bronze powder (OzoMetal LLC). The needed amount of bronze infiltrant $M_{bronze}$ depended on the post-sintering void fraction of the printed matrix and was calculated according to an equation:

$$M_{bronze} = \left(\frac{M * V_{design} * \text{shrink}}{M_{avg}} - \frac{M}{\rho_{SS}}\right) * \beta * Fill_{target} * \rho_{bronze}$$

where the terms within the parentheses give the total void volume of the part: the total volume of the printed part minus the volume occupied by stainless steel. The terms in the equation are as follows: M is the post-sintering measured mass of the individual sample, $M_{avg}$ is the average post-sintering mass of samples, shrink is the fractional volumetric shrinkage due to sintering (calculated by measuring part dimensions before and after sintering), $\rho_{SS}$ is the density of bulk SS316L, $\beta$ is the volumetric thermal expansion of stainless steel at 1000° C. which affects the void volume of the part (about 1.05), $Fill_{target}$ is the desired fractional fill of the total void volume, and $\rho_{bronze}$ is the density of liquid bronze (about 8.15 g/cm³). The sample was placed into an alumina crucible and the bronze powder was placed in contact with the sample. Additionally, sacrificial powder was poured into the sacrificial powder cavities. Two water-atomized powders were used as sacrificial powder: a smaller −100 mesh SS316L powder (particle diameter <150 µm; interstitial pore size about 60 µm) and a larger −40+80 mesh SS316 powder (particle diameter >180 µm, <425 µm; interstitial pore size about 300 µm), both purchased from Thermo Fisher Scientific (product numbers: 11089 and 42944). Sacrificial powder mass and volume were measured to calculate a pre-sintering void fraction of about 58%. Samples were placed into a quartz lined stainless steel sample holder and put into the furnace at about 800° C. by initially setting the sample inside the cooling zone, closing the end cap, and flowing argon at 1800 SCCM for 5 minutes to flush air from the tube. The samples were then moved to the heating zone, argon and hydrogen flow were set to 500 SCCM and 200 SCCM respectively, and the furnace was ramped to 1135° C. where it was held for 2 hours (ramp rate about 6° C./min). Samples were then cooled according to the same rapid cooling procedure used after sintering.

Leak Testing and Thermal Cycling: After fabrication, interface integrity was tested by connecting the capillary to a gas line, placing the sample underwater, and flowing argon through the interface. First, gas was allowed to flow freely to ensure the interface was unobstructed, then the channel opening was sealed with hot glue and the sample was pressurized to 100 PSI to test for leaks at the interface; in both cases, gas leaving the sample was detected by bubble formation. After leak testing the hot glue was removed from some samples and the samples were placed in an oven and the temperature was cycled 10 times from 25° C. to 350° C. and back down. After thermal cycling the interfaces were leak tested in the same manner as before.

Interface Imaging: Samples were cross-sectioned using a mill and imaged with SEM. While cutting parallel to the channel, the end mill pushed a small amount of metal into the capillaries and the channels of the samples, therefore, prior to imaging, this metal was pried out with tweezers using care not to touch the interface.

Leak Testing: Samples were leak tested to determine the integrity of the interfaces. In all samples gas was able to flow freely through the interfaces. Interfaces were pressurized to 100 PSI after plugging the small channel. The leak testing results indicate that the interfaces and channels were unobstructed by stainless steel powder or bronze infiltrant. The leak testing shows that the fabrication method can create interfaces that are able to hold the pressures used in most microfluidic applications.

Thermal Cycling: After leak testing, some samples were thermally cycled between 25° C. and 350° C. 10 times. Once thermal cycling was complete, samples were again leak tested and results were found to be the same as results prior to thermal cycling. That the results of leak testing did not change after thermal cycling indicates that these interfaces are stable through thermal cycling up to 350° C. and could be used in applications which require this, such as microscale gas chromatography.

SEM Imaging: FIG. 8G shows an SEM image taken after the interfaces of some samples were cross sectioned using an end mill. The interfaces show a relatively smooth connection between the capillaries and the printed channels with no apparent gaps between the capillary and the channel. The surfaces of the capillaries are significantly smoother than those of the printed channels. Additionally, with most interfaces, a small inward-facing ridge can be seen at the point where the capillary and the printed channel meet. Lastly, dead volumes in the interfaces are rare and small if present.

The SEM micrographs show low-dead-volume interfaces where gaps between the capillary and the printed channel seem to be filled with bronze infiltrant. Although there are ridges present at the interface, because the ridges are facing radially inward, they do not cause dead volumes, and therefore should not cause issues in microfluidic applications where dead volumes are problematic.

As used herein, the term "about" or "substantially" refers to an allowable variance of the term modified by "about" by ±10% or ±5%. Further, the terms "less than," "or less," "greater than", "more than," or "or more" include as an endpoint, the value that is modified by the terms "less than," "or less," "greater than," "more than," or "or more."

While various aspects and embodiments have been disclosed herein, other aspects and embodiments are contemplated. The various aspects and embodiment disclosed herein are for purposes of illustration and are not intended to be limiting.

What is claimed is:

1. A method for interfacing a metallic capillary in a microchannel of a metallic body, the method comprising:
    inserting a portion of the metallic capillary into a portion of the microchannel of the metallic body; and
    thermal bonding the portion of the metallic capillary to the portion of the microchannel of the metallic body, wherein thermal bonding the portion of the metallic capillary to the portion of the microchannel of the metallic body includes sintering the portion of the metallic capillary to the portion of the metallic body at a temperature of at least 1250° C.

2. The method of claim 1, wherein inserting a portion of the metallic capillary into a portion of the microchannel includes inserting the portion of the metallic capillary into the portion of the microchannel having a first width until the metallic capillary is adjacent an interior region of the microchannel having a second width less than the first width, the metallic capillary having a width greater than the second width of the interior region of the microchannel.

3. The method of claim 1, further comprising three-dimensional printing the metallic body including the microchannel.

4. The method of claim 3, wherein:
three-dimensional printing the metallic body including the microchannel includes three-dimensional printing the metallic body to include the portion of the microchannel having a first width and the microchannel including an interior portion having a second width less than the first width; and
inserting a portion of the metallic capillary into a portion of the microchannel of the includes inserting the portion of the metallic capillary into the portion of the microchannel having the first width, the metallic capillary having a width greater than the second width of the interior region of the microchannel.

5. The method of claim 3, wherein three-dimensional printing the metallic body including the microchannel includes three-dimensional printing the metallic body using a stainless steel powder.

6. A method for interfacing a metallic capillary in a microchannel of a metallic body, the method comprising:
inserting a portion of the metallic capillary into a portion of the microchannel of the metallic body;
thermal bonding the portion of the metallic capillary to the portion of the microchannel of the metallic body;
disposing a sacrificial powder at least proximate to the metallic capillary and the metallic body after thermal bonding the portion of the metallic capillary and the portion of the microchannel of the metallic body; and
infiltrating at least the portion of the metallic capillary thermally bonded to the portion of the microchannel of the metallic body with an infiltrant in the presence of the sacrificial powder disposed at least proximate to the metallic capillary and the metallic body.

7. The method of claim 6, wherein the infiltrant includes a bronze powder and the sacrificial powder includes a stainless steel powder.

8. The method of claim 6, wherein inserting a portion of the metallic capillary into a portion of the microchannel includes inserting the portion of the metallic capillary into the portion of the microchannel having a first width until the metallic capillary is adjacent an interior region of the microchannel having a second width less than the first width, the metallic capillary having a width greater than the second width of the interior region of the microchannel.

9. The method of claim 6, wherein thermal bonding the portion of the metallic capillary to the portion of the microchannel of the metallic body includes:
sintering the metallic capillary and the metallic body to a predetermined temperature of at least 1000° C. for a predetermined time of at least 10 minutes in the presence of argon and hydrogen; and
cooling the metallic capillary and the metallic body after heating to the predetermined temperature for the predetermined time.

10. The method of claim 9, wherein infiltrating at least the portion of the metallic capillary sintered to the portion of the microchannel of the metallic body with an infiltrant in the presence of the sacrificial powder disposed at least proximate to the metallic capillary and the metallic body includes infiltrating the metallic body along with the portion of the metallic capillary sintered to the portion of the microchannel of the metallic body with the infiltrant in the presence of the sacrificial powder disposed at least proximate to the metallic capillary and the metallic body.

11. The method of claim 9, wherein infiltrating at least the portion of the metallic capillary sintered to the portion of the microchannel of the metallic body with an infiltrant in the presence of the sacrificial powder disposed at least proximate to the metallic capillary and the metallic body includes infiltrating at least the portion of the metallic capillary sintered to the portion of the microchannel of the metallic body with the infiltrant in the presence of the sacrificial powder at a pressure of about −1 kPa or less.

12. The method of claim 6, wherein infiltrating at least the portion of the metallic capillary sintered to the portion of the microchannel of the metallic body with an infiltrant in the presence of the sacrificial powder disposed at least proximate to the metallic capillary and the metallic body includes infiltrating at least the portion of the metallic capillary sintered to the portion of the microchannel of the metallic body with the infiltrant in the presence of the sacrificial powder for at a predetermined time and at a predetermined temperature of at least 1000° C. to melt and solidify the infiltrant.

13. The method of claim 12, wherein at least the portion of the metallic capillary sintered to the portion of the microchannel of the metallic body with the infiltrant in the presence of the sacrificial powder forms a structure including the metallic capillary interfacing microchannel such that the metallic structure is devoid of gaps between the portion of the microchannel and the portion of the capillary.

* * * * *